US008605477B2

(12) United States Patent
Takemura

(10) Patent No.: US 8,605,477 B2
(45) Date of Patent: Dec. 10, 2013

(54) SEMICONDUCTOR MEMORY DEVICE

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 406 days.

(21) Appl. No.: 13/093,018

(22) Filed: Apr. 25, 2011

(65) Prior Publication Data

US 2011/0260158 A1    Oct. 27, 2011

(30) Foreign Application Priority Data

Apr. 27, 2010   (JP) .................................. 2010-101571
Apr. 27, 2010   (JP) .................................. 2010-102329

(51) Int. Cl.
    *G11C 5/06*   (2006.01)
(52) U.S. Cl.
    USPC ............................... 365/63; 365/51; 365/149
(58) Field of Classification Search
    USPC ........................................ 365/63, 51, 149, 72
    See application file for complete search history.

(56) References Cited

U.S. PATENT DOCUMENTS

| | | | |
|---|---|---|---|
| 4,466,081 A | 8/1984 | Masuoka | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — David Lam
(74) *Attorney, Agent, or Firm* — Fish & Richardson P.C.

(57) ABSTRACT

To provide a semiconductor memory device storing data, in which a transistor whose leakage current between a source/drain in off state is small is used as a writing transistor. In a matrix of a memory unit formed of two memory cells, in each of which a drain of a writing transistor is connected to a gate of a reading transistor and one electrode of a capacitor, a gate of the writing transistor, and the other electrode of the capacitor in a first memory cell are connected to a first word line, and a second word line, respectively. In a second memory cell, a gate of the writing transistor, and the other electrode of the capacitor are connected to the second word line, and the first word line, respectively. Further, to increase the degree of integration, gates of the reading transistors of memory cells are disposed in a staggered configuration.

31 Claims, 17 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,505,299 B2 * | 3/2009 | Takemura et al. ............... 365/63 |
| 7,674,650 B2 | 3/2010 | Akimoto et al. |
| 7,732,819 B2 | 6/2010 | Akimoto et al. |
| 7,994,000 B2 | 8/2011 | Asami |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203454 A1 | 8/2008 | Asami |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0156028 A1 | 6/2011 | Yamazaki et al. |
| 2011/0157961 A1 | 6/2011 | Yamazaki et al. |
| 2011/0176348 A1 | 7/2011 | Yamazaki et al. |
| 2011/0198593 A1 | 8/2011 | Kato et al. |
| 2011/0210339 A1 | 9/2011 | Yamazaki et al. |
| 2011/0249484 A1 | 10/2011 | Takemura |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-53164 A | 2/2001 |
| JP | 2002-076356 A | 3/2002 |
| JP | 2002-093178 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-338730 A | 12/2006 |
| JP | 2007-042172 A | 2/2007 |
| JP | 2008-244460 A | 10/2008 |
| JP | 2008-269751 A | 11/2008 |
| KR | 2008-0079611 A | 9/2008 |
| WO | 2004/114391 A1 | 12/2004 |
| WO | 2011080998 A1 | 7/2011 |
| WO | 2011080999 A1 | 7/2011 |
| WO | 2011086846 A1 | 7/2011 |
| WO | 2011096270 A1 | 8/2011 |
| WO | 2011105310 A1 | 9/2011 |
| WO | 2011125432 A1 | 10/2011 |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Janotti, A et al., "Native Point Defects in ZnO," Phys. Rev. B (Physical Review. B), 2007, vol. 76, No. 16, pp. 165202-1-165202-22.

International Search Report, PCT Application No. PCT/JP2011/058860, dated Jul. 12, 2011, 4 pages.

Written Opinion, PCT Application No. PCT/JP2011/058860, dated Jul. 12, 2011, 4 pages.

* cited by examiner

Signal same as Rm

Signal same as Rm

No current flow in on state

On state only when the potential is +4V

Portion in contact with the bit line is shared.

On state only when the potential is +2V

Off state only when the potential is +3V

SEMICONDUCTOR MEMORY DEVICE

TECHNICAL FIELD

The present invention relates to a memory device including a semiconductor.

BACKGROUND ART

There are many kinds of memory devices including semiconductors. For example, a dynamic random access memory (DRAM), a static random access memory (SRAM), an electrically erasable and programmable read only memory (EEPROM), a flash memory, and the like can be given.

In a DRAM, data is stored by holding charge in a capacitor which is provided in a memory cell. However, even when a transistor used for switching is in an off state, a slight amount of leakage current is generated between a source and a drain; thus, the data is lost within a relatively short time (several tens of seconds at the longest). Therefore, the data needs to be rewritten (refreshed) on a certain cycle (generally on a cycle of several tens of milliseconds).

In an SRAM, data is held by utilizing a bistable state of a flip-flop circuit. A CMOS inverter is generally used in a flip-flop circuit of an SRAM; however, six transistors are used in one memory cell and the degree of integration of the SRAM is lower than that of a DRAM. In addition, the data is lost when power is not supplied.

On the other hand, in an EEPROM or a flash memory, a so-called floating gate is provided between a channel and a gate and charge is stored in the floating gate, whereby data is held. The charge stored in the floating gate is held even after power supply to a transistor stops, which is why these memories are called non-volatile memories. As for a flash memory, Patent Document 1 may be referred to, for example.

In this specification, a memory having a floating gate, examples of which are an EEPROM and a flash memory, is called a floating gate non-volatile memory (FGNVM). Since multilevel data can be stored in one memory cell in an FGNVM, storage capacity can be large. Further, since the number of contact holes can be significantly decreased in a NAND-type flash memory, the degree of integration can be increased to some extent.

However, in a conventional FGNVM, high voltage is needed at the time of injection of charge to a floating gate or removal of the charge. Because of this, deterioration of a gate insulating film cannot be avoided and it is not possible to limitlessly repeat writing and erasing operations.

REFERENCE

Patent Document

[Patent Document 1] Japanese Published Patent Application No. S57-105889
[Patent Document 2] Japanese Published Patent Application No. 2001-53164

DISCLOSURE OF INVENTION

As described above, conventional semiconductor memory devices have good points and bad points and there has been no semiconductor devices meeting all conditions necessary for a practical device. In a memory device, reduction in power consumption is required. When the power consumption is high, the size of a device for supplying power needs to be larger, and an operating time on a battery is shortened. Moreover, a semiconductor element might be heated; thus, characteristics of the element might be deteriorated, and in some cases, a circuit is broken. In addition, there is preferably no limitation on the number of rewriting times of a memory device and it is desirable that rewriting can be performed one billion times or more. Needless to say, a high degree of integration is also needed.

In light of these points, a DRAM has difficulty in reducing power consumption because leakage current is generated and refreshing is performed all the time. Further, in an SRAM, there is another problem in that the degree of integration cannot be increased because six transistors are included in one memory cell. Furthermore, in an FGNVM, although the power consumption and the degree of integration are not problematic, the number of rewriting times is a hundred thousand or less.

In view of the above, it is a first object of one embodiment of the present invention to achieve the following three conditions at the same time: power consumed by a memory cell for holding memory is lower than that in a DRAM; the number of transistors used in one memory cell is five or less; and the number of rewriting times is one million or more. Further, it is a second object to achieve the following two conditions at the same time: data is held without power supply for 10 hours or longer, preferably 100 hours or longer; and the number of rewriting times is one million or more. Note that in this specification, the data holding time is the time until the amount of charge held in a memory cell is decreased to 90% of the initial amount.

In one embodiment of the present invention, in addition to the above objects, it is another object to provide a novel semiconductor device (specifically a novel semiconductor memory device). It is another object to provide a driving method of a novel semiconductor device (specifically a driving method of a semiconductor memory device). Further, it is another object to provide a manufacturing method of a novel semiconductor device (specifically a manufacturing method of a semiconductor memory device). In the present invention, at least one of the above-described objects is achieved.

Before embodiments of the present invention are described, terms used in this specification will be briefly explained. A source and a drain of a transistor have the same or substantially the same structure and function. Even if the structures are different, in this specification, when one of a source and a drain of a transistor is called a source, the other is called a drain for convenience, and they are not particularly distinguished for the reason that a potential applied to the source or the drain or a polarity of the potential is not definite. Therefore, a source in this specification can be alternatively referred to as a drain.

In this specification, "to be orthogonal to each other (in a matrix)" means not only to intersect with each other at right angles but also to be orthogonal to each other in the simplest circuit diagram even though the physical angle is not a right angle. In addition, "to be parallel to each other (in a matrix)" means to be parallel to each other in the simplest circuit diagram even though two wirings are provided so as to physically intersect with each other.

Further even when it is written in this specification that "to be connected", there is a case in which no physical connection is made in an actual circuit and a wiring is only extended. For example, in an insulated-gate field-effect transistor (MISFET) circuit, there is a case in which one wiring serves as gates of a plurality of MISFETs. In this case, one wiring may have a plurality of branches to gates in a circuit diagram. In this specification, the expression "a wiring is connected to a gate" is also used to describe such a case.

Note that in this specification, in referring to a specific row, column, or position in a matrix, the row, column, or position is expressed using a reference sign with a coordinate, for example as follows: "a reading transistor $RTr_{(n,m)}$", "a bias line $S_m$", "a capacitor $C1_{(n,m)}$", and "a bit line $R2_n$". In the case where the row, column, or position is not specified or the case where elements are collectively referred to, the following expressions may be used: "a reading transistor RTr", "a bias line S", "a capacitor C1", and "a bit line R2", or simply "a reading transistor", "a bias line", "a capacitor", and "a bit line".

In a first embodiment of the present invention, one memory cell includes a transistor as a writing transistor, in which leakage current between a source and a drain in an off state is small, another transistor (a reading transistor), and a capacitor. The conductivity type of the reading transistor is the same as or different from the conductivity type of the writing transistor. Further, as wirings connected to these, three kinds of wirings, that is, a writing word line, a bit line, and a reading word line, are prepared.

For example, if the writing transistor is an n-channel transistor, "the reading transistor having the same conductivity type as the writing transistor" is also an n-channel transistor. Further, for example, if the writing transistor is an n-channel transistor, "the reading transistor having a different conductivity type from the writing transistor" is a p-channel transistor.

The drain of the writing transistor is connected to a gate of the reading transistor and one electrode of the capacitor. Further, a gate of the writing transistor is connected to the writing word line; the source of the writing transistor and a source of the reading transistor are connected to the bit line; and the other electrode of the capacitor is connected to the reading word line.

In the writing transistor in an off state (in the case of an n-channel transistor, a state where the potential of the gate is lower than the potentials of the source and the drain), leakage current between the source and the drain needs to be $1 \times 10^{-20}$ A or smaller and is preferably $1 \times 10^{-21}$ A or smaller at an ambient temperature when the transistor is in use (e.g., 25° C.), or is preferably $1 \times 10^{-20}$ A or smaller at 85° C.

In the case of a general silicon semiconductor, it is difficult to realize leakage current having such a small value; however, such a value can be achieved with an insulated-gate transistor in which a wide bandgap semiconductor whose band gap is larger than that of silicon and is preferably 2.5 electron volts or more is processed in a preferable condition and is used as a channel Examples of the wide bandgap semiconductor include an oxide semiconductor, a sulfide semiconductor, and a nitride semiconductor. The oxide semiconductor is particularly preferable as a material of the writing transistor.

Although a variety of known materials can be used as the oxide semiconductor, a material with a band gap greater than or equal to 3 eV, preferably a material with a band gap greater than or equal to 3 eV and less than 3.6 eV, is desirable. In addition, it is desirable to use a material with an electron affinity greater than or equal to 4 eV, preferably a material with an electron affinity greater than or equal to 4 eV and less than 4.9 eV. In particular, an oxide including gallium and indium is preferable for the object of the present invention.

Among such materials, a material whose carrier concentration derived from a donor or an acceptor is less than $1 \times 10^{-14}$ cm$^{-3}$, preferably less than $1 \times 10^{-11}$ cm$^{-3}$ is desirable. Other than the oxide semiconductor, an oxynitride semiconductor (e.g., gallium oxide or gallium zinc oxide including nitrogen at 5 at. % to 20 at. %) may be used as well.

As the reading transistor, although there is no particular limitation on the leakage current between a source and a drain in an off state, smaller leakage current is preferable because power consumption can be reduced. Further, a transistor which operates at high speed is desirable in order to increase the reading speed. Specifically, it is preferable to use a transistor with a switching speed of 10 nanoseconds or less. Further, in both the writing transistor and the reading transistor, gate leakage current (leakage current between the gate and the source or between the gate and the drain) needs to be extremely small. Also in the capacitor, internal leakage current (leakage current between the electrodes) needs to be small. Each leakage current needs to be $1 \times 10^{-20}$ A or smaller and is preferably $1 \times 10^{-21}$ A or smaller at an ambient temperature when the transistor or the capacitor is in use (e.g., 25° C.).

The potential of the gate of the reading transistor is changed in accordance with the potential of the reading word line. As a result, the gate capacitance of the reading transistor is changed. That is, the gate capacitance of the reading transistor in the case where the reading transistor is in an on state is larger than that in the case where the reading transistor is in an off state. When change in the gate capacitance is larger than the capacitance of the capacitor, a problem is caused in operation of a memory cell.

Therefore, the capacitance of the capacitor is preferably larger than or equal to the gate capacitance of the reading transistor, further preferably larger than or equal to twice as large as the gate capacitance of the reading transistor. The capacitance of the capacitor is preferably 1 fF or smaller so that the semiconductor memory device operates at high speed.

The writing word line, the bit line, and the reading word line are arranged in a matrix. The writing word line is preferably orthogonal to the bit line, and the writing word line is preferably parallel to the reading word line so that matrix drive is performed.

An example of a circuit including a memory cell having the above-described structure is illustrated in FIG. 1A. Here, n and m are natural numbers of greater than or equal to two. In FIG. 1A, a memory cell including a writing transistor $WTr_{(n,m)}$, a reading transistor $RTr_{(n,m)}$, and a capacitor $C_{(n,m)}$ is illustrated. Here, a drain of the writing transistor $WTr_{(n,m)}$ is connected to a gate of the reading transistor $RTr_{(n,m)}$ and one electrode of the capacitor $C_{(n,m)}$. In this example, a bias line $S_m$ is included in addition to a writing word line $Q_n$, a bit line $R_m$, and a reading word line P. The writing word line $Q_n$ and the reading word line $P_n$ are parallel to each other, and the bit line $R_m$ and the bias line $S_m$ are parallel to each other. In addition, the writing word line $Q_n$ and the bit line $R_m$ are orthogonal to each other.

In addition, a gate of the writing transistor $WTr_{(n,m)}$ is connected to the writing word line $Q_n$. A source of the writing transistor $WTr_{(n,m)}$ and a source of the reading transistor $RTr_{(n,m)}$ are connected to the bit line $R_m$. A drain of the reading transistor $RTr_{(n,m)}$ is connected to the bias line $S_m$. The other electrode of the capacitor $C_{(n,m)}$ is connected to the reading word line $P_n$.

The circuit illustrated in FIG. 1A is the same memory cell that is described as a gain cell in Patent Document 2. Memory cells of this kind have been developed because the capacitance of a capacitor therein can be sufficiently small as compared to that in DRAMs. That is, in a gain cell, the necessary capacitance of the capacitor is determined relative to the gate capacitance of a reading transistor, whereas in a DRAM, the necessary capacitance of the capacitor is determined relative to the parasitic capacitance of a bit line.

When the capacitance of the capacitor can be made small, time required for charging and discharging of the capacitor, i.e., a switching period can be shortened. In the DRAM, charging and discharging of the capacitor is a rate-limiting factor which leads to limitation on operation speed. On the other hand, in the gain cell, as the design rule is reduced, the gate capacitance of the reading transistor and the capacitance of the capacitor are reduced; thus, a memory capable of extremely fast response can be manufactured.

Specifically, when the design rule is reduced to one tenth, the capacitance of the capacitor is reduced to one tenth and on resistance of the transistor is also reduced to one tenth; as a result, time required for switching is shortened to one hundredth. In contrast, the capacitance of the capacitor of a DRAM is not changed even when the on resistance of a transistor is reduced to one tenth; thus, the switching time is only reduced to one tenth. In other words, the operation speed of the gain cell can be ten times as high as that of the DRAM.

As described above, gain cells are expected to have excellent characteristics; however, gain cells have not been put into practical use because leakage current between a source and a drain in a transistor cannot be sufficiently suppressed. In general, even when the design rule is reduced to one tenth, leakage current cannot be reduced to one tenth and may rather be increased due to a variety of factors other than the design rule.

For instance, in a transistor in which a P-N junction is used for insulation, as the transistor is miniaturized, leakage current due to tunneling current between bands at the P-N junction is increased. Besides, in the case of a semiconductor with a small band gap (less than 2.5 electron volts), leakage current due to thermally excited carriers is also considerable. If leakage current cannot be suppressed, it is still difficult to reduce the capacitance of the capacitor.

In the case of forming a known insulated-gate transistor using silicon as a writing transistor of a gain cell, an advantage produced by using two transistors cannot be gained. For example, since leakage current in the transistor using silicon in an off state is approximately $10^{-14}$ A at the lowest, if the capacitance of the capacitor is approximately 10 fF like a general DRAM, charge stored in the capacitor is lost in one second or so. Thus, refreshing operation needs to be performed some dozen times per second in a manner similar to that of a general DRAM.

In the first place, the capacitance of the capacitor in a gain cell needs to be reduced because cost cannot be offset when a capacitor having the same capacitance is used in the gain cell in which one more transistor is provided than in a DRAM. Gain cells have a characteristic in that data can be read even when the capacitance of the capacitor is reduced to one tenth, for example.

However, when the capacitance of the capacitor is reduced to one tenth, the interval between refreshing operations is also reduced to one tenth. Thus, power consumption is increased and access to a memory is limited. Similarly, when the capacitance of the capacitor is reduced to one hundredth, the interval between refreshing operations is reduced to one hundredth, in which case the gain cell is not practical at all. Conventionally, leakage current in a writing transistor cannot be sufficiently reduced and thus such a gain cell has not been put into practical use.

In the case where the writing transistor is an insulated-gate transistor which is formed using the above-described wide bandgap semiconductor in its channel, leakage current between a source and a drain of a writing transistor $WTr_{(n,m)}$ can be so small that it cannot be measured by an ordinary method. By utilizing this fact, according to an embodiment of the present invention, a gain cell can be a practical memory cell.

A gain cell can be an extremely promising memory cell when leakage current in a transistor is sufficiently small. That is, since the capacitance of a capacitor can be made as small as the gate capacitance of a writing transistor or a reading transistor, a capacitor in a special shape (a stack capacitor or a trench capacitor) which is used in a DRAM need not to be provided, whereby the degree of freedom for design is increased and the process becomes simpler. In addition, a memory which can operate at high speed can be manufactured as described above.

For example, when leakage current is one hundred thousandth (approximately $10^{-20}$ A) of that in a silicon transistor, the interval between refreshing operations can be one thousand times as long as that in a DRAM (i.e., refreshing is performed once per minute) even when the capacitance of a capacitor is one thousandth of that in a DRAM. When leakage current is smaller, for example, $10^{-24}$ A or smaller, refreshing needs to be performed only once every few days.

Writing in such a gain cell means charging of a capacitor having much smaller capacitance than that in a DRAM as described above; therefore, even when characteristics of a writing transistor are not so excellent, writing can be performed as fast as or faster than that performed in an existing DRAM. For example, in the case where the capacitance of the capacitor illustrated in FIG. 1A is one thousandth of that of a capacitor of a DRAM, on-state current (or mobility) in the writing transistor may be one thousandth of that in a transistor of the DRAM.

Even if the mobility of the writing transistor is one hundredth of that of a transistor using silicon, writing can be performed at a speed 10 times as high as that of a normal DRAM. As described above, higher speed can be realized as the design rule is reduced.

An example of operation of the circuit illustrated in FIG. 1A will be described below. In the memory cell illustrated in FIG. 1A, the writing transistor $WTr_{(n,m)}$ is turned on by applying appropriate potential to the writing word line $Q_n$. By the potential of the bit line $R_m$ at this time, charge is injected to the drain of the writing transistor $WTr_{(n,m)}$. The amount of charge injected at this time is determined depending on the potential of the bit line $R_m$, the gate capacitance of the reading transistor $RTr_{(n,m)}$, the capacitance of the capacitor $C_{(n,m)}$, and the like and the result is thus always almost the same in the case where the conditions are the same, and variation is small. In this manner, data is written.

Then, by applying another appropriate potential to the writing word line $Q_n$, the writing transistor $WTr_{(n,m)}$ is turned off. At this time, charge in the drain of the writing transistor $WTr_{(n,m)}$ is kept. At the time of reading, an appropriate potential is applied to the reading word line $P_n$, and the change of the reading transistor $RTr_{(n,m)}$ is monitored; thus, the written data can be found.

Another example of a memory cell having the above-described structure is illustrated in FIG. 11A. Here, n and m are natural numbers of greater than or equal to two. In FIG. 11A, a memory cell including an n-channel writing transistor $WTr_{(n,m)}$, a p-channel reading transistor $RTr_{(n,m)}$, and a capacitor $C_{(n,m)}$ is illustrated. Here, a drain of the writing transistor $WTr_{(n,m)}$ is connected to a gate of the reading transistor $RTr_{(n,m)}$ and one electrode of the capacitor $C_{(n,m)}$.

In addition, a gate of the writing transistor $WTr_{(n,m)}$ is connected to a writing word line $Q_n$. A source of the writing transistor $WTr_{(n,m)}$ and a source of the reading transistor $RTr_{(n,m)}$ are connected to a bit line $R_m$. A drain of the reading transistor RTr$_{(n,m)}$ is connected to a bias line S$_m$. The other electrode of the capacitor C$_{(n,m)}$ is connected to the reading word line P$_n$.

A memory device is formed of the memory cells illustrated in FIG. 1A or FIG. 11A arranged in a matrix. As is apparent from the drawings, one writing word line and one reading word line are needed per row in a matrix, and one bit line and one bias line are needed per column in matrix. Therefore, for a matrix with N rows and M columns (N and M are natural numbers of greater than or equal to two) of a memory device, (2N+2M) wirings are necessary.

A second embodiment of the present invention is a semiconductor memory device which includes a memory unit formed using two or more writing transistors, two or more reading transistors, and two or more capacitors, which are similar to those used in the first embodiment. Here, the conductivity type of the writing transistors may be the same as or different from the conductivity type of the reading transistors.

Further in this embodiment, two word lines are arranged instead of the writing word line and the reading word line which are used in the first embodiment of the present invention. On some occasions, the individual word lines function as writing word lines, on other occasions as reading word lines.

Further in this embodiment, two bit lines are arranged instead of the bit line and the bias line which are used in the first embodiment of the present invention. On some occasions, the individual bit lines function as bit lines, on other occasions as bias lines.

In addition, a drain of a first writing transistor is connected to one electrode of a first capacitor and a gate of a first reading transistor. A drain of a second writing transistor is connected to one electrode of a second capacitor and a gate of a second reading transistor.

Further, a source of the first writing transistor, a source of the first reading transistor, and a drain of the second reading transistor are connected to a first bit line. A source of the second writing transistor, a source of the second reading transistor, and a drain of the first reading transistor are connected to a second bit line.

A gate of the first writing transistor and the other electrode of the second capacitor are connected to a first word line. A gate of the second writing transistor and the other electrode of the first capacitor are connected to a second word line.

The first word line and the second word line are parallel to each other, and the first bit line and the second bit line are parallel to each other. In addition, the first word line and the first bit line are orthogonal to each other.

An example of a memory unit having the above-described structure is illustrated in FIG. 2A and FIG. 12A. Here, n and m are natural numbers of greater than or equal to two. In other words, illustrated is a memory unit including two memory cells, which are a first memory cell including a writing transistor WTr1$_{(n,m)}$, a reading transistor RTr1$_{(n,m)}$, and a capacitor C1$_{(n,m)}$; and a second memory cell including a writing transistor WTr2$_{(n,m)}$, a reading transistor RTr2$_{(n,m)}$, and a capacitor C2$_{(n,m)}$.

In both FIG. 2A and FIG. 12A, the writing transistor WTr1$_{(n,m)}$ and the writing transistor WTr2$_{(n,m)}$ are n-channel transistors. In FIG. 2A, the reading transistor RTr1$_{(n,m)}$ and the reading transistor RTr2$_{(n,m)}$ are n-channel transistors, and in FIG. 12A, the reading transistor RTr1$_{(n,m)}$ and the reading transistor RTr2$_{(n,m)}$ are p-channel transistors.

In each memory cell, a drain of the writing transistor is connected to one electrode of the capacitor and a gate of the reading transistor. The potential of an intersection at which these transistors and the capacitor are connected to one another is the same as the potential of the gate of the reading transistor and relates to on and off of the reading transistor. Therefore, hereinafter, such intersections are referred to as a node F1$_{(n,m)}$ and a node F2$_{(n,m)}$.

Further, a source of the writing transistor WTr1$_{(n,m)}$, a source of the reading transistor RTr1$_{(n,m)}$, and a drain of the reading transistor RTr2$_{(n,m)}$ are connected to a bit line R1$_m$. In addition, a source of the writing transistor WTr2$_{(n,m)}$, a source of the reading transistor RTr2$_{(n,m)}$, and a drain of the reading transistor RTr1$_{(n,m)}$ are connected to a bit line R2$_m$.

Further, a gate of the writing transistor WTr1$_{(n,m)}$ and the other electrode of the capacitor C2$_{(n,m)}$ are connected to a word line Q1$_n$, and a gate of the writing transistor WTr2$_{(n,m)}$ and the other electrode of the capacitor C1$_{(n,m)}$ are connected to a word line Q2$_n$. The word line Q1$_n$ and the word line Q2$_n$ are parallel to each other, and the bit line R1$_m$ and the bit line R2$_m$ are parallel to each other. In addition, the word line Q1$_n$ and the bit line R1$_m$ are orthogonal to each other.

A memory device is formed of the memory units illustrated in FIG. 2A or FIG. 12A arranged in a matrix as illustrated in FIG. 2B or FIG. 12B. As illustrated in the drawing of the memory units, two writing word lines are needed per row in a matrix, and two bit lines are needed per column in a matrix. Therefore, for a matrix with N rows and M columns (N and M are natural numbers of greater than or equal to two), (2N+2M) wirings are necessary.

Since one memory unit includes two memory cells, the matrix with N rows and M columns, in fact, includes twice as many memory cells as the matrix formed by arranging memory cells illustrated in FIG. 1A or FIG. 11A. Therefore, if the same number of memory cells are included in the matrix of memory units of FIG. 2A or FIG. 12A and the matrix of memory cells of FIG. 1A or FIG. 11A, the number of wirings in the matrix of memory units of FIG. 2A or FIG. 12A is half that in the matrix of memory cells of FIG. 1A or FIG. 11A. Thus, the area per memory cell can be reduced as compared to the memory cell illustrated in FIG. 1A or FIG. 11A.

For higher integration, a contact portion (e.g., a contact hole) may be shared with the memory unit in the next row. An example is illustrated in FIG. 4A. In FIG. 4A, a range of a memory unit indicated by a dotted rectangle is set larger than the actual range in order to avoid the overlap with wirings. In FIG. 4A, although reading transistors are p-channel transistors, the same can be applied to the case in which the reading transistors are n-channel transistors.

Here, the circuit configuration inside the memory unit in the n-th row is the same as that of FIG. 2A, but the circuit configuration inside the memory unit in the (n+1)-th row is inverted from the circuit configuration of FIG. 2A. As a result of this, the contact portion in which the memory unit in the n-th row and m-th column is connected to the bit line R2$_m$ and the contact portion in which the memory unit in the (n+1)-th row and m-th column is connected to the bit line R2$_m$ can be unified, and the area per memory unit or per memory cell can be reduced.

In a third embodiment of the present invention, the first bit line in the column adjacent to the second bit line in the second embodiment of the present invention is used as a substitute for the second bit line. An example of a matrix including memory units having the above structure is illustrated in FIG. 4B. Here, n and m are natural numbers of greater than or equal to two. Note that in FIG. 4B, a range of a memory unit indicated by a dotted rectangle is set larger than the actual range in order to avoid the overlap with wirings.

The memory unit in the n-th row and m-th column indicated by the dotted rectangle in FIG. 4B includes two writing transistors, two reading transistors having a different conductivity type from the writing transistors, and two capacitors.

Here, the writing transistors are n-channel transistors, and the reading transistors are p-channel transistors. The circuit configuration inside this memory unit is the same as that illustrated in FIG. 12A.

In addition, a drain of a first writing transistor $WTr1_{(n,m)}$ is connected to one electrode of a first capacitor $C1_{(n,m)}$ and a gate of a first reading transistor $RTr1_{(n,m)}$. A drain of a second writing transistor $WTr2_{(n,m)}$ is connected to one electrode of a second capacitor $C2_{(n,m)}$ and a gate of a second reading transistor $RTr2_{(n,m)}$.

A gate of the first writing transistor $WTr1_{(n,m)}$ and the other electrode of the second capacitor $C2_{(n,m)}$ are connected to a word line $Q1_n$, and a gate of the second writing transistor $WTr2_{(n,m)}$ and the other electrode of the first capacitor $C1_{(n,m)}$ are connected to a word line $Q2_n$.

Further, a source of the first writing transistor $WTr1_{(n,m)}$, a source of the first reading transistor $RTr1_{(n,m)}$, and a drain of the second reading transistor $RTr2_{(n,m)}$ are connected to a bit line $R_m$ which is a first bit line. A source of the second writing transistor $WTr2_{(n,m)}$, a source of the second reading transistor $RTr2_{(n,m)}$, and a drain of the first reading transistor $RTr1_{(n,m)}$ are connected to a bit line $R_{m+1}$ which is a second bit line.

The bit line $R_{m+1}$ also serves as a first bit line of an adjacent memory unit in the n-th row and (m+1)-th column. As is apparent from FIG. 4B, two word lines are needed per row in a matrix, and one bit line is needed per column in a matrix. Therefore, for a matrix with N rows and M columns (N and M are natural numbers of greater than or equal to two) of a memory device, (2N+M+1) wirings are necessary in consideration of wirings in columns on both ends.

That is, as compared to the above-described second embodiment of the present invention, the number of wirings can be reduced and the area per memory cell can be reduced. In the case of sharing the contact portion as in FIG. 4A, higher integration can be realized as well.

Three embodiments of the present invention have been described above; however, it will be obvious from embodiments of BEST MODE FOR CARRYING OUT THE INVENTION that according to a technical idea of the present invention, the present invention is not limited to the above-described embodiments and can be implemented in another embodiment.

By employing any of the above-described structures, at least one of the above-described objects can be achieved. In each of the above structures, since the writing operation is performed by normal driving of a transistor (turning the transistor on or off), the problem of deterioration of an insulating film cannot occur. Therefore, there is substantially no limit on the number of rewriting times in the semiconductor memory devices having the above-describe structures according to the present invention. In addition, in respect to data holding, since leakage current is extremely small, power consumption can be reduced as compared to a conventional DRAM. Further, in the above embodiments, the number of transistors used in one memory cell is two.

The present invention also shows excellent characteristics in respect to a data holding period. Charge can be held for 10 hours or longer, or preferably 100 hours or longer by making leakage current between the source and the drain of the transistor in an off state, gate leakage current, and internal leakage current in the capacitor meet the above-described conditions. Moreover, by improving conditions, charge can be held for one month or longer, or one year or longer.

In the case where the charge is reduced due to the leakage current, refreshing may be performed in a manner similar to that of a conventional DRAM; the interval between refreshing operations is determined in accordance with the above-mentioned period during which charge can be held. In the case where charge is held for such a long period as described above, refreshing is necessary, for example, only once a month or once a year. Frequent refreshing which is needed in a conventional DRAM is not necessary and thus power consumption of a semiconductor memory device is reduced.

Note that in a conventional DRAM, operation of writing data is needed again every time when the data is read; on the other hand, in the above-described semiconductor memory devices according to embodiments of the present invention, such operation is unnecessary because data is not lost by operation of reading data. Such a feature has been able to be realized in an SRAM conventionally. In the above-described semiconductor memory devices according to embodiments of the present invention, the number of transistors used in one memory cell is five or less, typically two, which is smaller than that in the case of a conventional SRAM. Furthermore, when one of the transistors is formed using an oxide semiconductor in a thin film shape, the degree of integration can be increased because the transistor can be stacked over a conventional silicon semiconductor.

Further, in the case where gates of reading transistors of memory cells are disposed in a staggered configuration and the memory cells each include a transistor including an oxide semiconductor, the degree of integration can be further increased.

As for the degree of integration, in the present invention, the absolute value of capacitance necessary for a memory cell can be reduced. In a DRAM, for example, capacitance of at least 30 fF is needed because operation is interfered unless the capacitance of a memory cell is almost the same as or larger than the wiring capacitance. However, capacitance is proportional to the area. In the case where the degree of integration is increased, the area of one memory cell decreases; thus, necessary capacitance cannot be secured. For this reason, a capacitor having a large capacitance needs to be formed in a DRAM by employing a special shape or a special material.

In contrast, the capacitance of the capacitor in the present invention can be determined relative to the gate capacitance of the reading transistor. That is, as the degree of integration is increased, the gate capacitance of the reading transistor is decreased; therefore, the capacitance necessary for the capacitor is also decreased in the same proportion. Therefore, even when the degree of integration is increased, a capacitor having basically the same structure can be used.

Further, in the semiconductor memory devices having the above-described structures, high voltage, which is needed for writing and erasing in an FGNVM, is not needed. Further, in an FGNVM, since at the time of writing, charge is injected to the floating gate in one direction in a non-equilibrium state, variation in the amount of charge is large. Although it is possible to store multilevel data in accordance with the amount of charge held in the floating gate, in consideration of the variation in the amount of charge, 4-level (2-bit) data is general. Higher voltage needs to be used in order to store data of a larger number of bits.

On the other hand, charge is reversibly stored in the capacitor in the above-described structures according to the present invention, and thus variation is small; for example, variation in the threshold voltage of the reading transistor due to injection of charge can be 0.5 volts or smaller. Thus, more data can be held in one memory cell within a narrower range of voltage; consequently, voltage for writing or reading can be lower. For example, the voltage used for writing or reading data of 4 bits (16 level) can be 10 volts or lower.

BEST MODE FOR CARRYING OUT THE INVENTION

Figure 1A:
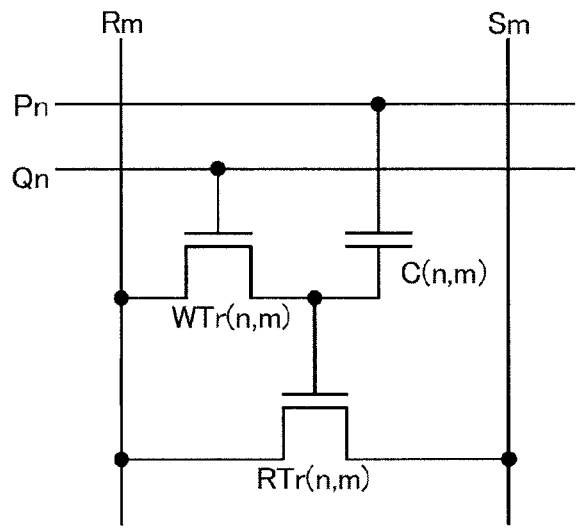
FIGS. 1A to 1E illustrate an example of a semiconductor memory device of the present invention and an example of a driving method thereof.

Hereinafter, embodiments will be described with reference to the drawings. Note that the embodiments can be implemented in various modes, and it is easily understood by those skilled in the art that modes and details can be changed in various ways without departing from the spirit and scope of the present invention. Therefore, the present invention is not construed as being limited to the description of the embodiments below.

The structures, the conditions, and the like disclosed in any of the following embodiments can be combined with those disclosed in other embodiments as appropriate. Note that in structures described below, the same portions or portions having similar functions are denoted by the same reference numerals in different drawings, and detailed description thereof is not repeated in some cases.

Embodiment 1

In this embodiment, an example of operation of the semiconductor memory device illustrated in FIG. 1A will be described with reference to FIGS. 1B to 1E. Note that specific values of potentials are given below for the purpose of aid for understanding a technical idea of the present invention. Needless to say, such values are changed in accordance with various characteristics of a transistor, a capacitor, or the like, or for convenience of the practitioner. Further, the semiconductor memory device illustrated in FIG. 1A can write or read data using a method other than a method described below.

Here, the writing transistor $WTr_{(n,m)}$ and the reading transistor $RTr_{(n,m)}$ are both n-channel transistors. The writing transistor $WTr_{(n,m)}$ and the reading transistor $RTr_{(n,m)}$ are turned on (current flows through the transistors) when the potential of the gate becomes higher than the potential of either the source or the drain by 1 V or more, and the writing transistor $WTr_{(n,m)}$ and the reading transistor $RTr_{(n,m)}$ are in an off state (current does not flow) under the other conditions.

A portion of the gate capacitance of the reading transistor $RTr_{(n,m)}$, which fluctuates depending on the gate bias, is negligibly small as compared to the capacitance of the capacitor $C_{(n,m)}$. Further, the parasitic capacitance of the writing transistor $WTr_{(n,m)}$, the parasitic capacitance of the reading transistor $RTr_{(n,m)}$, the parasitic capacitance generated between wirings, and the like, which are not illustrated in the drawings, are assumed to be 0. In FIGS. 1B to 1E, a circle on a transistor indicates that the transistor is in an on state, and a cross mark on a transistor indicates that the transistor is in an off state. As for a transistor which is turned on under a specific condition, notes are added in the drawings.

Figure 1B:
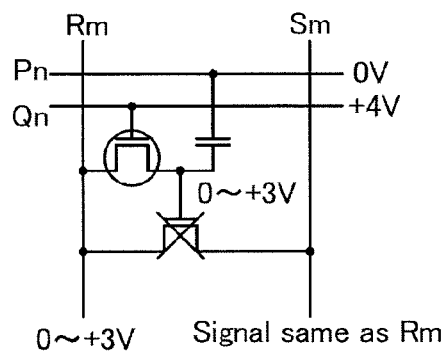

First, writing in this memory cell will be described. At the time of writing, as illustrated in FIG. 1B, the potential of the reading word line $P_n$ is set to 0 V. The potential of the bit line $R_m$ is set to one of four levels of 0 V, +1 V, +2 V, and +3 V in accordance with data to be written. The potential of the bias line $S_m$ is set so as to be equal to the potential of the bit line $R_m$.

In order to set the potential of the bias line $S_m$ to such a value, it is preferable to include a circuit or the like which is necessary for a semiconductor memory device. Although the potential of the bias line $S_m$ is preferably equal to the potential of the bit line $R_m$, there may be a difference of 0.2 V or less between the potential of the bias line $S_m$ and the potential of the bit line $R_m$. Alternatively, the phase difference may be less than or equal to 10% of the pulse width.

In other words, it is preferable to provide a circuit, a signal processing unit, or the like for making the potential of the bias line $S_m$ and the potential of the bit line $R_m$ equal to each other. Alternatively, it is preferable to employ a signal processing method or the like. Even if a slight difference is generated between the potential of the bias line $S_m$ and the potential of the bit line $R_m$ as a result, power consumption can be reduced as compared to the case of not employing such a measure. For simplicity, it is assumed below that the potential of the bias line $S_m$ is equal to the potential of the bit line $R_m$.

Next, the potential of the writing word line $Q_n$ is set to +4 V. Then, the writing transistor $WTr_{(n,m)}$ is turned on and the potential of the drain of the writing transistor $WTr_{(n,m)}$ becomes close to the potential of the source of the writing transistor (i.e., the bit line KO. Here, the potential of the drain of the writing transistor $WTr_{(n,m)}$ becomes equal to the potential of the bit line $R_m$.

At this time, the potential of the gate of the reading transistor $RTr_{(n,m)}$ is equal to the potential of the drain of the writing transistor $WTr_{(n,m)}$, and is also equal to the potential of the source of the reading transistor $RTr_{(n,m)}$ (i.e., the bit line $R_m$). Further, the potential of the drain of the reading transistor $RTr_{(n,m)}$ (i.e., the bias line $S_m$) is equal to the potential of the bit line $R_m$. That is, the potentials of the gate, the source, and the drain of the reading transistor $RTr_{(n,m)}$ are equal to each other. Therefore, the reading transistor $RTr_{(n,m)}$ is in an off state.

In this state, the potential of the writing word line $Q_n$ is set to 0 V, so that charge injected to the drain of the writing transistor $WTr_{(n,m)}$ is held without any change. Thus, data can be written.

Figure 1C:
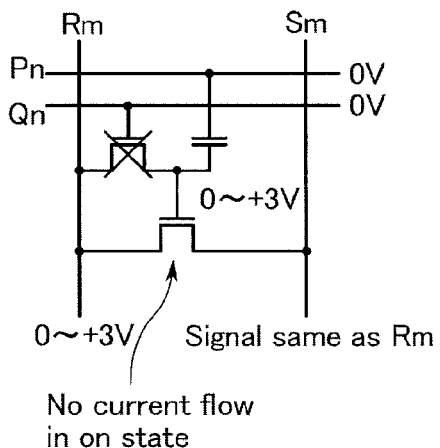

Next, in the case where writing is performed in a row other than the n-th row, as illustrated in FIG. 1C, the potential of the writing word line $Q_n$ and the potential of the reading word line $P_n$ are set to 0 V. The potential of the bit line $R_m$ is set to one of four levels of 0 V, +1 V, +2 V, and +3 V in accordance with data to be written in the row other than the n-th row. The potential of the bias line $S_m$ is equal to the potential of the bit line $R_m$.

The potential of the drain of the writing transistor $WTr_{(n,m)}$ is 0 V, +1 V, +2 V, or +3 V in accordance with the written data. In this state, the potential (0 V) of the gate of the writing transistor $WTr_{(n,m)}$ is lower than the potential (0 V to +3 V) of the source of the writing transistor $WTr_{(n,m)}$ (the bit line R) and the potential (0 V to +3 V) of the drain of the writing transistor $WTr_{(n,m)}$; accordingly, the writing transistor $WTr_{(n,m)}$ is turned off.

Meanwhile, the potential (0 V to +3 V) of the gate of the reading transistor $RTr_{(n,m)}$ is occasionally higher than the potential (0 V to +3 V) of the source (i.e., the bit line $R_m$) and the potential (0 V to +3 V) of the drain (i.e., the bias line $S_m$), and the reading transistor $RTr_{(n,m)}$ may be on in some cases. However, since the potential of the source (i.e., the bit line $R_m$) and the potential of the drain (i.e., the bias line $S_m$) are equal to each other, current does not flow between the source and the drain. In other words, even when the reading transistor $RTr_{(n,m)}$ is on, power is not consumed owing to the reading transistor $RTr_{(n,m)}$ in an on state.

Figure 1D:
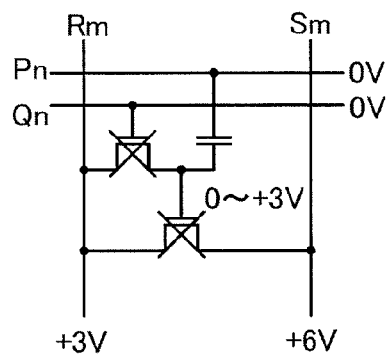

Next, a reading method will be described. At the time of reading, the potential of the bias line $S_m$ is set different from the potential of the bit line $R_m$. That is, as illustrated in FIG. 1D, the potential of the writing word line Q, and the potential of the reading word line P, are both set to 0 V. In addition, the potential of the bit line $R_m$ is set to +3 V, and the potential of the bias line $S_m$ is set to +6 V. In this state, the potential of the gate of the reading transistor $RTr_{(n,m)}$ is 0 V, +1 V, +2 V, or +3 V in accordance with the written data, and is lower than the potential of the source (i.e., the bit line $R_m$) and the potential of the drain (i.e., the bias line $S_m$); accordingly, the reading transistor $RTr_{(n,m)}$ is off.

Figure 1E:
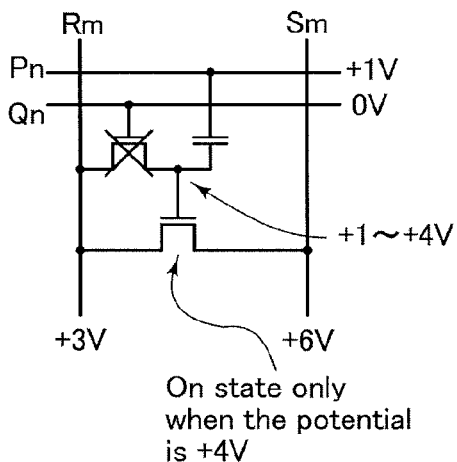

Next, as illustrated in FIG. 1E, the potential of the reading word line $P_n$ is increased to +1 V. Then, since the gate of the reading transistor $RTr_{(n,m)}$ is connected to the reading word line $P_n$ via the capacitor $C_{(n,m)}$, the potential of the gate of the reading transistor $RTr_{(n,m)}$ is increased by the amount of increase in the potential of the reading word line P. That is, the potential of the gate of the reading transistor $RTr_{(n,m)}$ becomes +1 V, +2 V, +3 V, or +4 V in accordance with the written data.

In the case where the potential of the gate of the reading transistor $RTr_{(n,m)}$ is +4 V, the reading transistor $RTr_{(n,m)}$ is on; in the other cases, the reading transistor $RTr_{(n,m)}$ is off. At this time, the potential of the gate of the reading transistor $RTr_{(n,m)}$ becomes +4 V in the case where the potential of the bit line $R_m$ is +3 V at the time of writing. In other words, if the reading transistor $RTr_{(n,m)}$ is on when the potential of the reading word line $P_n$ is +1 V, it can be found that the potential of the bit line $R_m$ at the time of writing is +3 V.

When the reading transistor $RTr_{(n,m)}$ is turned on, current flows through the bit line $R_m$; thus, by detection of the current, it can be found that the reading transistor $RTr_{(n,m)}$ is in an on state. If a capacitor is provided at an end portion of the bit line $R_m$, it can also be found that the reading transistor $RTr_{(n,m)}$ is in an on state from the fact that the initial potential (+3 V) of the bit line $R_m$ becomes close to the potential (+6 V) of the bias line $S_m$.

In a similar manner, in the case where the potential of the reading word line P, is set to +2 V, the potential of the gate of the reading transistor $RTr_{(n,m)}$ becomes +2 V, +3 V, +4 V, or +5 V. Only when the potential of the gate of the reading transistor $RTr_{(n,m)}$ is +4 V or +5 V, the reading transistor $RTr_{(n,m)}$ is on; in the other cases, the reading transistor $RTr_{(n,m)}$ is off.

At this time, the potential of the gate of the reading transistor $RTr_{(n,m)}$ becomes +4 V or +5 V in the case where the potential of the bit line $R_m$ is +2 V or +3 V at the time of writing. Further, in the case where the potential of the bit line $R_m$ at the time of writing is +2 V, the reading transistor $RTr_{(n,m)}$ is off in the state of FIG. 1E and turned on when the potential of the reading word line $P_n$ is increased to +2 V.

Furthermore, in the case where the potential of the reading word line $P_n$ is set to +3 V, the potential of the gate of the reading transistor $RTr_{(n,m)}$ becomes +3 V, +4 V, +5 V, or +6 V. Only when the potential of the gate of the reading transistor $RTr_{(n,m)}$ is +3 V, the reading transistor $RTr_{(n,m)}$ is off; in the other cases, the reading transistor $RTr_{(n,m)}$ is on. At this time, the potential of the gate of the reading transistor $RTr_{(n,m)}$ becomes +3 V in the case where the potential of the bit line $R_m$ is 0 V at the time of writing. Thus, written data can be found.

Note that a capacitor may be connected to the bit line $R_m$ and the potential of the capacitor may be measured to read data. For example, if the potential of the gate of the reading transistor $RTr_{(n,m)}$ is +5 V in FIG. 1E, the reading transistor $RTr_{(n,m)}$ is on and the potential of the bit line $R_m$ becomes close to the potential of the bias line $S_m$; however, when the potential of the bit line $R_m$ becomes +5 V which is equal to the potential of the gate of the reading transistor $RTr_{(n,m)}$, the reading transistor $RTr_{(n,m)}$ is turned off. That is, the potential of the bit line $R_m$ is higher than or equal to +4 V and lower than +5 V.

Similarly, in the case where the potential of the gate of the reading transistor $RTr_{(n,m)}$ is +4 V, the potential of the bit line $R_m$ is higher than or equal to +3 V and lower than +4 V. Further, in the case where the potential of the gate of the reading transistor $RTr_{(n,m)}$ is +6 V, the potential of the bit line $R_m$ is higher than or equal to +5 V and lower than +6 V. In the case where the potential of the gate of the reading transistor $RTr_{(n,m)}$ is +3 V, the reading transistor $RTr_{(n,m)}$ is off; therefore, the potential of the bit line $R_m$ does not change from the initial value (+3 V).

In the above-described manner, the four-level (two-bit) data can be written and read. Needless to say, much more data such as eight-level (three-bit) data or sixteen-level (four-bit) data can be written and read similarly. Alternatively, two-level (one-bit) data can be written and read.

In the above description, although the parasitic capacitance and the gate capacitance of the reading transistor $RTr_{(n,m)}$ are much smaller than the capacitance of the capacitor $C_{(n,m)}$ and negligible for the capacitance of the capacitor $C_{(n,m)}$, potentials to be applied need to be determined in view of these capacitances in an actual memory cell.

The gate capacitance of the reading transistor $RTr_{(n,m)}$ greatly fluctuates between an on state and an off state; therefore, the potential of the gate of the reading transistor $RTr_{(n,m)}$ is influenced by the fluctuation. As the ratio of the gate capacitance of the reading transistor $RTr_{(n,m)}$ to the capacitance of the capacitor $C_{(n,m)}$ is higher, the influence is bigger. Accordingly, the capacitance of the capacitor $C_{(n,m)}$ is preferably larger than or equal to twice as large as the gate capacitance of the reading transistor $RTr_{(n,m)}$.

Note that in order that multi-level (multivalued) data be stored by varying the amount of charge held in the memory cell to a plurality of levels, it is necessary that variation in the amount of charge held is small. In the semiconductor memory circuit and the semiconductor memory device which are described in this embodiment, variation in the amount of charge held is small, which is suitable for this purpose.

Embodiment 2

Figure 11A:
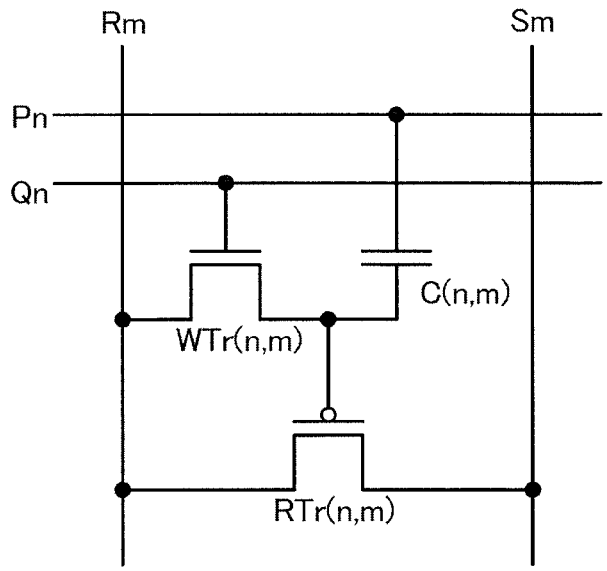
FIGS. 11A to 11E illustrate an example of a semiconductor memory device of the present invention and an example of a driving method thereof.

In this embodiment, an example of operation of the semiconductor memory device illustrated in FIG. 11A will be described with reference to FIGS. 11B to 11E. Note that specific values of potentials are given below for the purpose of aid for understanding a technical idea of the present invention. Needless to say, such values are changed in accordance with various characteristics of a transistor, a capacitor, or the like, or for convenience of the practitioner. Further, the semiconductor memory device illustrated in FIG. 11A can write or read data using a method other than a method described below.

Here, the writing transistor $WTr_{(n,m)}$ is an n-channel transistor, and the reading transistor $RTr_{(n,m)}$ is a p-channel transistor. The writing transistor $WTr_{(n,m)}$ is turned on (current flows through the transistor) when the potential of the gate becomes higher than the potential of either the source or the drain by 1 V or more, and the writing transistor $WTr_{(n,m)}$ is in an off state (current does not flow) under the other conditions. The reading transistor $RTr_{(n,m)}$ is turned on (current flows through the transistor) when the potential of the gate becomes lower than the potential of either the source or the drain by 1 V or more, and the reading transistor $RTr_{(n,m)}$ is in an off state (current does not flow) under the other conditions.

A portion of the gate capacitance of the reading transistor $RTr_{(n,m)}$, which fluctuates depending on the gate bias, is negligibly small as compared to the capacitance of the capacitor $C_{(n,m)}$. Further, the parasitic capacitance of the writing transistor $WTr_{(n,m)}$, the parasitic capacitance of the reading transistor $RTr_{(n,m)}$, the parasitic capacitance generated between wirings, and the like, which are not illustrated in the drawings, are assumed to be 0. In FIGS. 11B to 11E, a circle on a transistor indicates that the transistor is in an on state, and a cross mark on a transistor indicates that the transistor is in an off state. As for a transistor which is turned on under a specific condition, notes are added in the drawings. In the following example, the potential of the bias line $S_m$ is always 0 V.

Figure 11B:
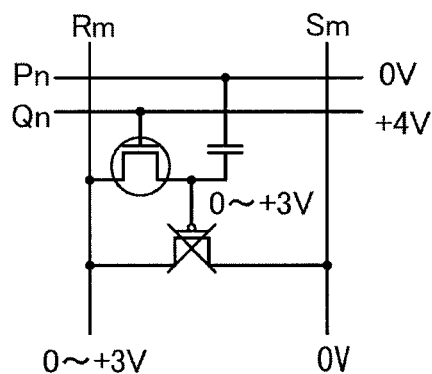

First, writing in this memory cell will be described. At the time of writing, as illustrated in FIG. 11B, the potential of the reading word line $P_n$ is set to 0 V. The potential of the bit line $R_m$ is set to one of four levels of 0 V, +1 V, +2 V, and +3 V in accordance with data to be written. Next, the potential of the writing word line Q, is set to +4 V. Then, the writing transistor $WTr_{(n,m)}$ is turned on and the potential of the drain of the writing transistor $WTr_{(n,m)}$ becomes close to the potential of the source of the writing transistor (i.e., the bit line $R_m$). Here, the potential of the drain of the writing transistor $WTr_{(n,m)}$ becomes equal to the potential of the bit line $R_m$.

At this time, the potential of the gate of the reading transistor $RTr_{(n,m)}$ is equal to the potential of the drain of the writing transistor $WTr_{(n,m)}$. That is, the potential of the gate of the reading transistor $RTr_{(n,m)}$ is higher than or equal to 0 V and is also equal to the potential of the source of the reading transistor $RTr_{(n,m)}$ (i.e., the bit line $R_m$).

Further, the potential of the drain of the reading transistor $RTr_{(n,m)}$ (i.e., the bias line $S_m$) is 0 V. That is, the potential of the gate of the reading transistor $RTr_{(n,m)}$ is higher than or equal to the potential of the source or the drain thereof. Therefore, the reading transistor $RTr_{(n,m)}$ is in an off state. Thus, data can be written.

Note that keeping the reading transistor $RTr_{(n,m)}$ in an off state as much as possible even at the time of writing is effective in reducing leakage current of the reading transistor $RTr_{(n,m)}$, which flows from the gate to the source or from the gate to the drain. In general, such leakage current is large when a transistor is in an on state and is extremely small when a transistor is in an off state.

Because such leakage current is a leak of charge that is held in the capacitor $C_{(n,m)}$, the more leakage current flows, the more the data holding time is decreased. In this embodiment, the reading transistor $RTr_{(n,m)}$ is turned on only at the time of reading, which is excellent in terms of storage of data.

Figure 11C:
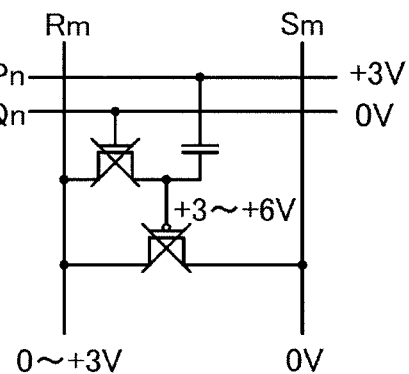

Next, in the case where writing is performed in a row other than the n-th row, as illustrated in FIG. 11C, the potential of the writing word line $Q_n$ is set to 0 V. In addition, the potential of the reading word line $P_n$ is set to +3 V. The potential of the bit line $R_m$ is set to one of four levels of 0 V, +1 V, +2 V, and +3 V in accordance with data to be written in the row other than the n-th row.

Since the drain of the writing transistor $WTr_{(n,m)}$ is connected to the reading word line $P_n$, via the capacitor $C_{(n,m)}$, the potential of the drain of the writing transistor $WTr_{(n,m)}$ is increased by 3 V in accordance with the change in the potential of the reading word line $P_n$ (i.e., increase in potential from 0 V, which is the state illustrated in FIG. 11B, to +3 V, which is the state illustrated in FIG. 11C). That is, the potential of the drain of the writing transistor $WTr_{(n,m)}$ becomes +3 V, +4 V, +5 V, or +6 V in accordance with the written data.

In this state, the potential (0 V) of the gate of the writing transistor $WTr_{(n,m)}$ is lower than the potential (0 V to +3 V) of the source of the writing transistor $WTr_{(n,m)}$ (the bit line R) and the potential (+3 V to +6 V) of the drain of the writing transistor $WTr_{(n,m)}$; accordingly, the writing transistor $WTr_{(n,m)}$ is turned off.

Further, the potential (+3 V to +6 V) of the gate of the reading transistor $RTr_{(n,m)}$ is higher than the potential (0 V to +3 V) of the source of the reading transistor $RTr_{(n,m)}$ (i.e., the bit line $R_m$) and the potential (0 V) of the drain of the reading transistor $RTr_{(n,m)}$ (i.e., the bias line $S_m$); accordingly, the reading transistor $RTr_{(n,m)}$ is off.

Figure 11D:
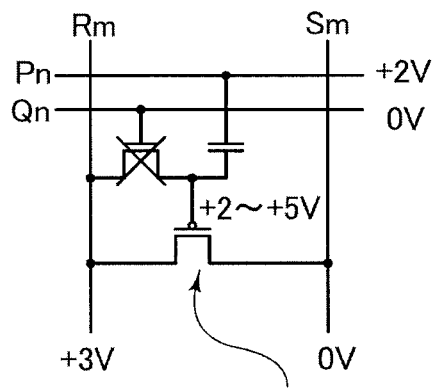

Next, reading operation will be described. As illustrated in FIG. 11D, the potential of the writing word line $Q_n$ is set to 0 V. In addition, the potential of the reading word line $P_n$ is set to +2 V, and the potential of the bit line $R_m$ is set to +3 V. In this state, the potential of the drain of the writing transistor $WTr_{(n,m)}$ is +2 V, +3 V, +4 V, or +5 V in accordance with the written data. If the potential of the gate of the reading transistor $RTr_{(n,m)}$ is +2 V, the reading transistor $RTr_{(n,m)}$ is on; in the other cases, the reading transistor $RTr_{(n,m)}$ is off.

At this time, the potential of the gate of the reading transistor $RTr_{(n,m)}$ becomes +2 V in the case where the potential of the bit line $R_m$ is 0 V at the time of writing. In other words, if the reading transistor $RTr_{(n,m)}$ is on when the potential of the reading word line $P_n$ is +2 V, it can be found that the potential of the bit line $R_m$ at the time of writing is 0 V.

When the reading transistor $RTr_{(n,m)}$ is turned on, current flows through the bit line $R_m$; thus, by detection of the current, it can be found that the reading transistor $RTr_{(n,m)}$ is in an on state. If a capacitor is provided in an end portion of the bit line $R_m$, it can also be found that the reading transistor $RTr_{(n,m)}$ is in an on state from the fact that the initial potential (+3 V) of the bit line $R_m$ becomes close to the potential (0 V) of the bias line $S_m$.

Figure 11E:
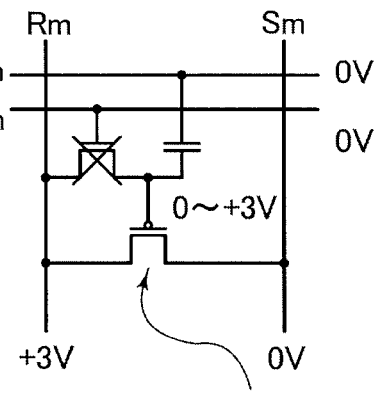

Similarly, as illustrated in FIG. 11E, in the case where the potential of the reading word line $P_n$ is set to 0 V, the potential of the gate of the reading transistor $RTr_{(n,m)}$ becomes 0 V, +1 V, +2 V, or +3 V. Only when the potential of the gate of the reading transistor $RTr_{(n,m)}$ is +3 V, the reading transistor $RTr_{(n,m)}$ is off; in the other cases, the reading transistor $RTr_{(n,m)}$ is on.

At this time, the potential of the gate of the reading transistor $RTr_{(n,m)}$ becomes +3 V in the case where the potential of the bit line $R_m$ is +3 V at the time of writing. In other words, if the reading transistor $RTr_{(n,m)}$ is off when the potential of the reading word line $P_n$ is 0 V, it can be found that the potential of the bit line $R_m$ at the time of writing is +3 V. In this manner, the state of the reading transistor $Rtr_{(n,m)}$ at the time when the potential of the reading word line P, is changed is detected, so that the value of data held in the memory cell can be obtained.

Note that a capacitor may be connected to the bit line $R_m$ and the potential of the capacitor may be measured to read data. For example, if the potential of the gate of the reading transistor $RTr_{(n,m)}$ is +2 V in FIG. 11E, the reading transistor $RTr_{(n,m)}$ is on and the potential of the bit line $R_m$ becomes close to the potential of the bias line $S_m$; however, when the potential of the bit line $R_m$ becomes +2 V which is equal to the potential of the gate of the reading transistor $RTr_{(n,m)}$, the reading transistor $RTr_{(n,m)}$ is turned off. That is, the potential of the bit line $R_n$ is higher than or equal to +2 V and lower than +3 V.

Similarly, in the case where the potential of the gate of the reading transistor $RTr_{(n,m)}$ is +1 V, the potential of the bit line $R_m$ is higher than or equal to +1 V and lower than +2 V. Further, in the case where the potential of the gate of the reading transistor $RTr_{(n,m)}$ is 0 V, the potential of the bit line $R_m$ is higher than or equal to 0 V and lower than +1 V. In the case where the potential of the gate of the reading transistor $RTr_{(n,m)}$ is +3 V, the reading transistor $RTr_{(n,m)}$ is off; therefore, the potential of the bit line $R_m$ does not change from the initial value (+3 V).

In the above-described manner, the four-level (two-bit) data can be written and read. Needless to say, much more data such as eight-level (three-bit) data or sixteen-level (four-bit) data can be written and read similarly. Alternatively, two-level (one-bit) data can be written and read.

In the above description, although the parasitic capacitance and the gate capacitance of the reading transistor $RTr_{(n,m)}$ are much smaller than the capacitance of the capacitor $C_{(n,m)}$ and ignored, potentials to be applied need to be determined in view of these capacitances in an actual memory cell.

The gate capacitance of the reading transistor $RTr_{(n,m)}$ greatly fluctuates between an on state and an off state; therefore, the potential of the gate of the reading transistor $RTr_{(n,m)}$ is influenced by the fluctuation. As the ratio of the gate capacitance of the reading transistor $RTr_{(n,m)}$ to the capacitance of the capacitor $C_{(n,m)}$ is higher, the influence is bigger. Accordingly, the capacitance of the capacitor $C_{(n,m)}$ is preferably larger than or equal to twice as large as the gate capacitance of the reading transistor $RTr_{(n,m)}$.

Note that in order that multi-level (multivalued) data be stored by varying the amount of charge held in the memory cell to a plurality of levels, it is necessary that variation in the amount of charge held is small. In the semiconductor memory circuit and the semiconductor memory device which are described in this embodiment, variation in the amount of charge held is small, which is suitable for this purpose.

Embodiment 3

In this embodiment, an example of the shape and a manufacturing method of the semiconductor memory device described in Embodiment 1 will be described. In this embodiment, an oxide semiconductor containing gallium and indium is used for the writing transistor and a single crystal silicon semiconductor is used for the reading transistor. Therefore, the writing transistor is stacked over the reading transistor.

That is, an insulated gate transistor including a single crystal silicon semiconductor which is provided over a single crystal silicon substrate is used as the reading transistor and a transistor in which an oxide semiconductor is used is formed thereover as the writing transistor. Note that although an example in which a semiconductor memory device is formed over a single crystal silicon substrate is described in this embodiment, the semiconductor memory device can be provided over another kind of substrate.

Figure 5A:
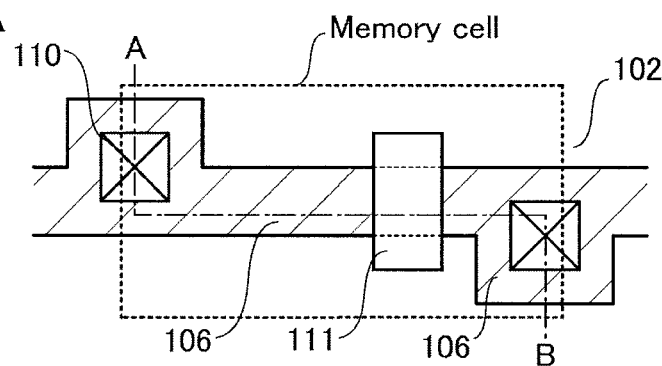
FIGS. 5A to 5D illustrate an example of layout and the like of wirings in a semiconductor memory device of the present invention.

An example of layout of a memory cell of the semiconductor memory device of this embodiment is illustrated in FIGS. 5A to 5D. In FIG. 5A, main wirings, main electrodes, and the like provided over a single crystal silicon substrate are illustrated. An element separation region 102 is formed over the substrate. A conductive region 106 is formed using a conductive material or doped silicon over the substrate, and part thereof serves as a source and a drain of the reading transistor. There is a region in which adjacent conductive regions 106 are separated from each other by a gate electrode 111 of the reading transistor. A first connection electrode 110 is provided over part of the conductive region 106.

The degree of integration is increased in such a manner that the first connection electrode 110 or the bias line S is shared by a memory cell and an adjacent memory cell as illustrated in the drawing. In the semiconductor memory device illustrated in FIGS. 5A to 5D, given that the minimum feature size is F, the area per memory cell is $18F^2$. Note that in FIGS. 5A to 5D, a range indicated by a dotted rectangle as a memory cell is set larger than the actual range in order to avoid the overlap with another wiring.

A material which forms an ohmic contact with an oxide semiconductor to be deposited later is preferable as a material of the gate electrode 111 or the first connection electrode 110. As an example of such a material, a material whose work function W is almost the same as or smaller than the electron affinity $\phi$ of the oxide semiconductor (an energy gap between the lowest end of the conduction band of the oxide semiconductor and the vacuum level) can be given. In other words, a material whose work function satisfies a relation, $W<\phi+0.3$ [eV], may be used. For example, titanium, molybdenum, or titanium nitride can be given.

Figure 5B:
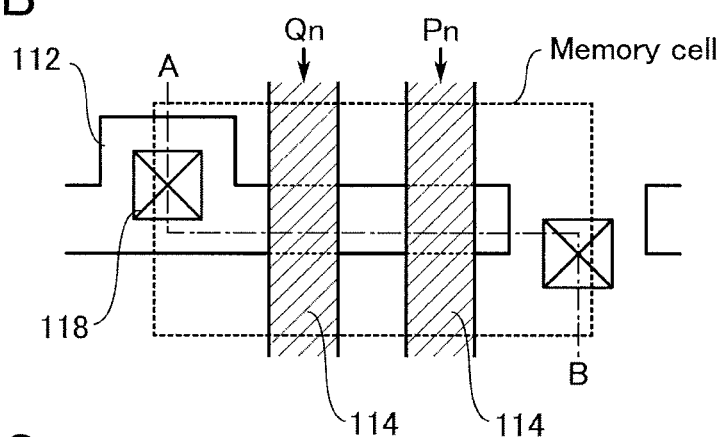

Main wirings, main electrodes, and the like, focusing on the transistor including an oxide semiconductor which is formed over the circuit illustrated in FIG. 5A, are illustrated in FIG. 5B. A plurality of island-shaped oxide semiconductor regions 112 and a plurality of first wirings 114 are formed. The first wirings 114 serve as a writing word line and a reading word line.

Part of the first wiring 114 overlaps with the oxide semiconductor and serves as the gate electrode of the writing transistor. The oxide semiconductor region 112 is in contact with the gate electrode 111 in a lower layer. A capacitor is formed in a portion where part of the first wiring 114 overlaps with the gate electrode 111. Further, a second connection electrode 118 is provided over part of the oxide semiconductor region 112 in order to connect the oxide semiconductor region 112 to an upper layer (e.g., a bit line).

Figure 5C:
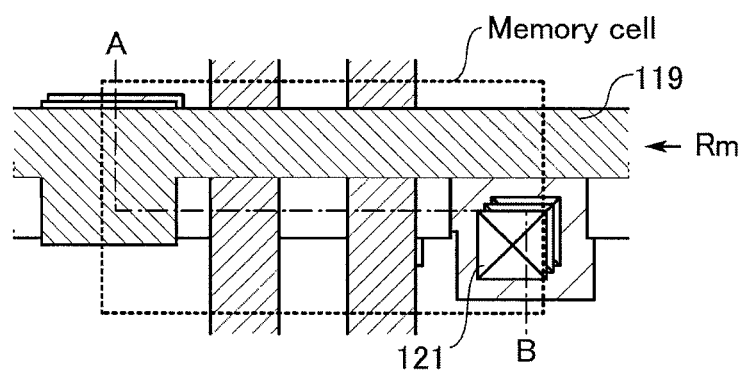

FIG. 5C illustrates a state in which the structure in FIG. 5A overlaps with the structure in FIG. 5B and a second wiring 119 is formed over the transistor including an oxide semiconductor. In FIG. 5C, the structures are shifted a little from each other so as to see the overlap. The second wiring 119 forms a bit line. A third connection electrode 121 is provided so as to overlap with the second connection electrode 118 for further connection to an upper layer (e.g., a bias line).

Figure 5D:
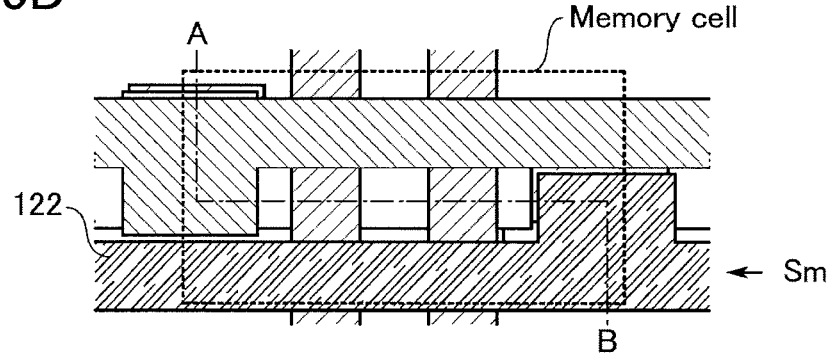

FIG. 5D illustrates the state in which a third wiring 122 is provided over the second wiring 119. The third wiring 122 forms a bias line. In FIGS. 5A to 5D, the width of the conductive region 106, the width of the first wiring 114, and the like have the minimum feature size F. That is, each of the line width and the line interval is F. In that case, the size of the memory cell is $18F^2$. Note that a dot A and a dot B indicate the same positions throughout FIGS. 5A to 5D.

Hereinafter, a manufacturing method of the semiconductor memory device having the above-described structure will be described. FIGS. 6A to 6D and FIGS. 7A to 7C are cross-sectional views taken along a line linking the dot A to the dot B in FIGS. 5A to 5D. In this embodiment, a p-type single crystal silicon substrate is used as a substrate. A manufacturing process will be described below in numerical order of the cross-sectional views.

<FIG. 6A>

Figure 6A:
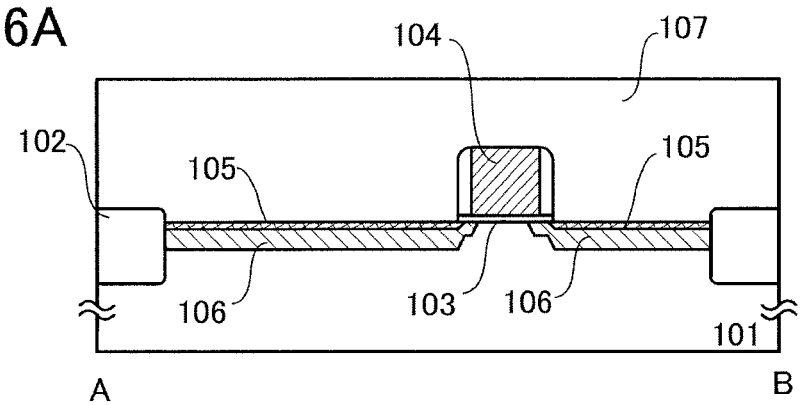
FIGS. 6A to 6D illustrate an example of a manufacturing process of a semiconductor memory device of the present invention.
Figure 6B:
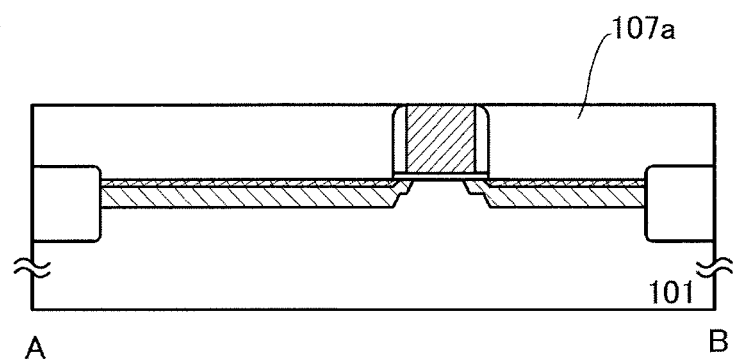
Figure 6C:
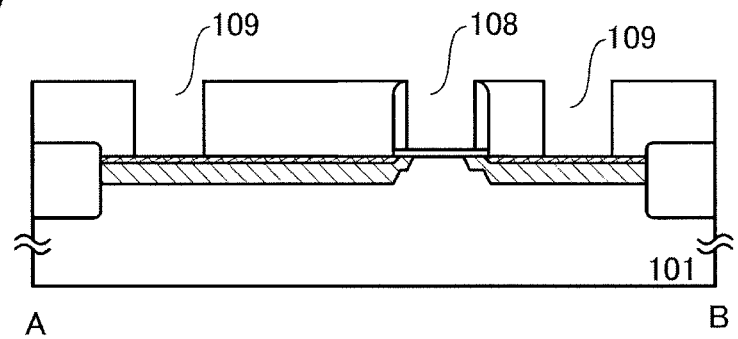

First, with the use of a known semiconductor manufacturing technique, the element separation region 102, the conductive region 106 formed using n-doped silicon, a gate insulating film 103, a dummy gate 104, and a first interlayer insulator 107 are formed over a p-type single crystal silicon substrate 101. A sidewall may be provided on a side surface of the dummy gate 104 as illustrated in FIG. 6A.

Polycrystalline silicon may be used for the dummy gate 104. The thickness of the gate insulating film 103 is preferably 10 nm or more so that generation of leakage current is suppressed. In order that gate capacitance be less than the capacitance of a capacitor to be formed later, a material having a low relative permittivity, such as silicon oxide, is preferably used as a dielectric of the gate insulating film 103. A silicide region 105 may be formed over a surface of the conductive region 106 so as to increase conductivity.

The first interlayer insulator 107 may be formed of a single layer or a multilayer and may include a stress liner for causing a distortion in a channel of the transistor. Planarizing a film in the uppermost layer by a spin coating method facilitates a later step. For example, as the first interlayer insulator 107, a multilayer film formed in such a manner that a silicon nitride film is formed by a plasma CVD method and a planarized silicon oxide film is formed by a spin coating method thereover may be used.

<FIG. 6B>

In the case where a surface of the first interlayer insulator 107 is sufficiently planar, the first interlayer insulator 107 is etched by a dry etching method and the dry etching is stopped upon exposure of an upper surface of the dummy gate 104. A chemical mechanical polishing (CMP) method may be used instead of the dry etching method. The surface of the first interlayer insulator 107 may be planarized by a CMP method first, and then etching may be further conducted by a dry etching method. Further alternatively, after the interlayer insulator is etched to some extent by a dry etching method, planarizing treatment by a CMP method may be performed. By processing the first interlayer insulator 107 in the above-described manner, a second interlayer insulator 107a having a planar surface is obtained and the surface of the dummy gate 104 is exposed.

<FIG. 6C>

Next, the dummy gate 104 is selectively etched and a first opening 108 is formed. In the case where polycrystalline silicon is used as a material of the dummy gate 104, 2% to 40% TMAH (tetramethyl ammonium hydroxide), preferably 20% to 25% TMAH may be used for the etching. In addition, a second opening 109 reaching the silicide region 105 is formed by selectively etching the second interlayer insulator 107a using a photolithography technique.

<FIG. 6D>

A single-layer or a multilayer film of a conductive material is deposited in the first opening 108 and the second opening 109. A material which forms an ohmic contact with an oxide semiconductor to be deposited later is preferable as the conductive material. Further, this conductive film also serves as the gate electrode of the reading transistor (here, an n-channel transistor); therefore, a conductive material which has an appropriate physical property value, such as a work function, is preferable in terms of deciding the threshold voltage of the transistor. When these two conditions cannot not be satisfied by one material, a plurality of films is formed so that each condition is satisfied. For example, a multilayer film including titanium nitride and tantalum nitride as conductive materials may be used.

Figure 6D:
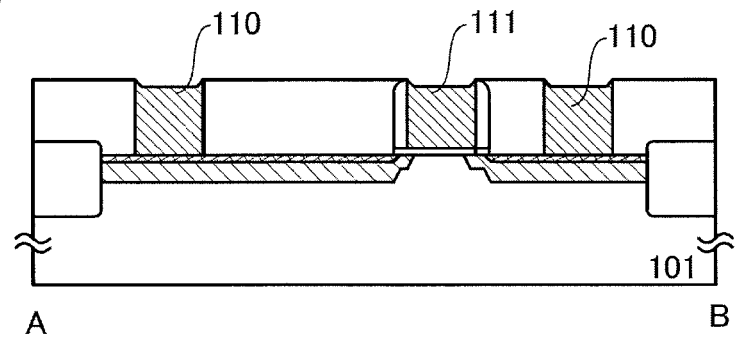

Next, the film of the conductive material is etched by a CMP method to be planarized. This step may be stopped upon exposure of the second interlayer insulator 107a or some time after the exposure of the second interlayer insulator 107a. Thus, as illustrated in FIG. 6D, the first connection electrode 110 and the gate electrode 111 of the reading transistor are formed. After that, surface treatment using plasma including chlorine may be performed in order that hydrogen included in the vicinity of the surface of the second interlayer insulator 107a be reduced. The treatment is not necessarily performed when the hydrogen concentration of the second interlayer insulator 107a is sufficiently low. The hydrogen concentration in a region 100 nm deep from the surface of the second interlayer insulator 107a is lower than $1 \times 10^{18}$ cm$^{-3}$, preferably lower than $1 \times 10^{16}$ cm$^{-3}$.

<FIG. 7A>

Then, an oxide semiconductor film having a thickness of 3 nm to 20 nm is fouled by a sputtering method. A method other than a sputtering method may be employed as a method for forming the oxide semiconductor film. The oxide semiconductor preferably contains gallium and indium. The hydrogen concentration in the oxide semiconductor film may be lower than $1 \times 10^{18}$ cm$^3$, preferably lower than $1 \times 10^{16}$ cm$^{-3}$ in order to increase the reliability of the semiconductor memory device. The composition ratio (gallium/indium) may be higher than or equal to 0.5 and lower than 2, and is preferably higher than or equal to 0.9 and lower than 1.2. The oxide semiconductor may also include zinc in addition to gallium and indium.

The island-shaped oxide semiconductor region 112 is formed by etching the oxide semiconductor film. The oxide semiconductor region 112 is preferably subjected to heat treatment so that semiconductor characteristics are improved. A similar effect can also be obtained by performing oxygen plasma treatment. The heat treatment and the oxygen plasma treatment may be performed separately or concurrently. Thus, a structure in which the gate electrode 111 and the oxide semiconductor region 112 are in contact with each other and the first connection electrode 110 and the oxide semiconductor region 112 are in contact with each other can be obtained.

Then, a gate insulating film 113 is formed by a known deposition method such as a sputtering method. In order that generation of leakage current be reduced, the thickness of the gate insulating film 113 is preferably 10 nm or more and the hydrogen concentration in the gate insulating film is preferably lower than $1\times10^{18}$ cm$^{-3}$, further preferably lower than $1\times10^{16}$ cm$^{-3}$. For this purpose, heat treatment, chlorine plasma treatment, or oxygen plasma treatment may be performed.

Silicon oxide, aluminum oxide, hafnium oxide, lanthanum oxide, aluminum nitride, or the like may be used for the gate insulating film. Alternatively, a composite oxide having a bandgap of larger than or equal to 6 eV and smaller than or equal to 8 eV, such as a composite oxide of aluminum and gallium (the ratio of aluminum to gallium is preferably higher than or equal to 0.5 and lower than or equal to 3), may be used. A multilayer film of these materials may be used as well as a single-layer film thereof.

The gate insulating film 113 also serves as a dielectric of a capacitor which is to be formed later and is preferably formed using a material having a relative permittivity of 10 or more so that the capacitance of the capacitor is larger than the gate capacitance of the reading transistor. Heat treatment may also be performed after the gate insulating film is formed in order to improve characteristics of the oxide semiconductor region 112.

<FIG. 7B>

The plurality of first wirings 114 is formed using a conductive material. The first wirings 114 serve as a writing word line and a reading word line. Part of the writing word line serves as the gate electrode of the transistor including an oxide semiconductor. It is preferable that a material of a portion facing the oxide semiconductor in the first wiring 114 have a work function which is larger than the electron affinity of the oxide semiconductor by 0.5 eV or more. Tungsten, gold, platinum, p-type silicon, and the like can be given as examples of such a material.

The capacitor 116 in which the gate insulating film 113 as a dielectric is provided between the gate electrode 111 and the reading word line is formed. The capacitor 116 is defined by the overlap of the gate electrode 111 and the reading word line; the area of the overlapped part is preferably larger than or equal to 100 nm$^2$ and smaller than or equal to 0.01 µm$^2$.

Next, an ion of an element which is oxidized more easily than an oxide semiconductor is implanted in the oxide semiconductor region 112 by a known ion implantation method. Examples of such an element are titanium, zinc, magnesium, silicon, phosphorus, boron, and the like. In general, boron and phosphorus are used in a conventional semiconductor process and thus easy to use; particularly, as an ion to be implanted into the above-described thin second gate insulating film 113 or the oxide semiconductor region 112, an ion of phosphorus whose atomic weight is greater than the atomic weight of boron is preferable.

It is desirable that hydrogen is mixed as little as possible in these ions. The hydrogen concentration in the ions is preferably 0.1% or lower. It is known that hydrogen serves as a donor of an oxide semiconductor. When hydrogen is mixed in the ions, hydrogen implanted into the oxide semiconductor moves in the oxide semiconductor and the reliability of the element is decreased.

In the oxide semiconductor, the implanted ions are combined with oxygen and the oxygen deficiency is caused; thus, the oxide semiconductor exhibits n-type conductivity. An oxide semiconductor is different from a silicon semiconductor in that many oxide semiconductors can obtain appropriate conductivity without high-temperature heat treatment which is needed in the case of a silicon semiconductor for recovery of crystallinity after ion implantation.

In this manner, a region 115 exhibiting n-type conductivity is formed in the oxide semiconductor region 112. It is preferable that conditions of ion implantation be set so that carrier (electron) concentration in the region is $1\times10^{-19}$ cm$^{-3}$ or more. The region 115 exhibiting n-type conductivity is formed in a self-aligned manner using the first wiring 114 as a mask. Since high-temperature heat treatment is unnecessary, the implanted ions hardly diffuse again, and the area where the region 115 exhibiting n-type conductivity and the first wiring 114 overlap with each other is extremely small. Further, a region into which ions are not implanted serves as a channel.

Figure 7A:
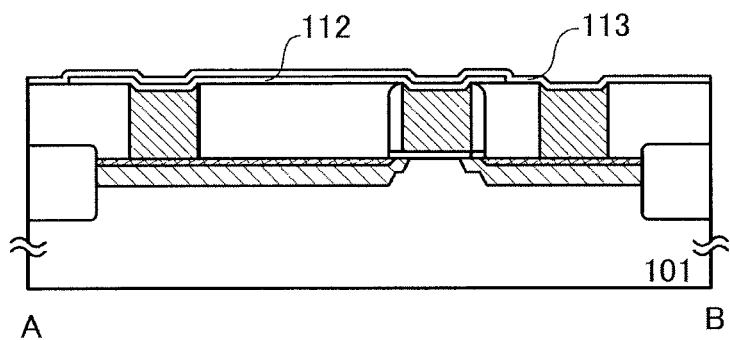
FIGS. 7A to 7C illustrate an example of a manufacturing process of a semiconductor memory device of the present invention.
Figure 7B:
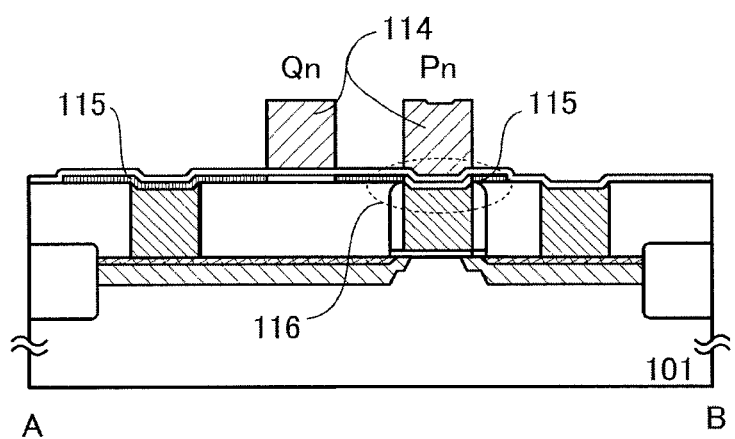

Note that even when an oxide semiconductor has an extremely low concentration of carriers and is nearly intrinsic, an electron is injected from a metal material which forms an ohmic contact with the oxide semiconductor to a portion of the oxide semiconductor which is in contact with the metal material. Thus, a portion within several tens of nanometers from the metal material exhibits favorable conductivity. Accordingly, although the oxide semiconductor region over the gate electrode 111 illustrated in FIG. 7B is not subjected to doping, the oxide semiconductor region can be regarded as a conductor.

<FIG. 7C>

After that, a third interlayer insulator 117 of a single-layer thin film or a multilayer thin film is formed. A surface of the third interlayer insulator 117 is planarized and selectively etched so as to form a contact hole reaching the region 115 exhibiting n-type conductivity, and the second connection electrode 118 is embedded therein. Then, the second wiring 119 is formed. The second wiring 119 is a bit line.

Figure 7C:
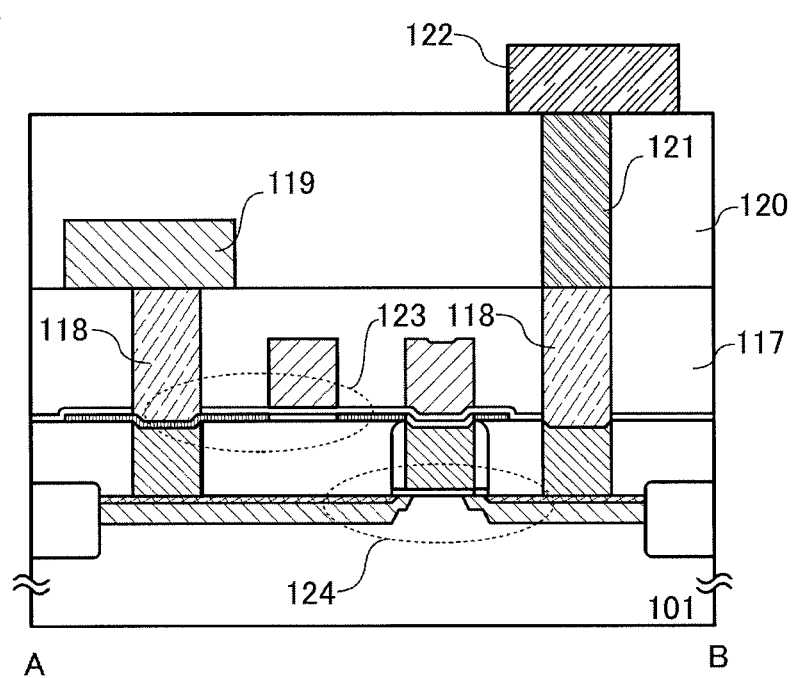

After that, a fourth interlayer insulator 120 of a single-layer thin film or a multilayer thin film is formed over the second wiring 119. Then, a surface of the fourth interlayer insulator 120 is planarized and selectively etched so as to form a contact hole reaching part of the second connection electrode 118, and the third connection electrode 121 is embedded therein. Then, the third wiring 122 is formed. The third wiring 122 is a bias line. A wiring similar to the second wiring 119 or the third wiring 122 may be formed parallel to the reading word line or the writing word line. In this manner, a memory cell of a semiconductor memory device, which includes a writing transistor 123 and a reading transistor 124 as illustrated in FIG. 7C, and a memory unit including the memory cell can be manufactured.

Embodiment 4

In this embodiment, an example of the shape of the semiconductor memory device described in Embodiment 2 will be described. In this embodiment, an oxide semiconductor containing gallium and indium is used for the writing transistor and a single crystal silicon semiconductor is used for the reading transistor. Therefore, the writing transistor is stacked over the reading transistor. For the details of the manufacturing method of the semiconductor memory device illustrated in this embodiment, Embodiment 3 can be referred to.

Figure 17A:
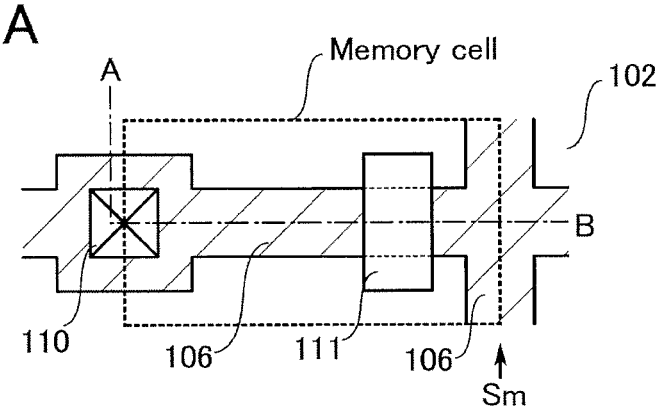
FIGS. 17A to 17D illustrate an example of layout and the like of wirings in a semiconductor memory device of the present invention.

An example of layout of a memory cell of the semiconductor memory device of this embodiment is illustrated in FIGS. 17A to 17D. In FIG. 17A, main wirings, main electrodes, and the like provided over a single crystal silicon substrate are illustrated. An element separation region 102 is formed over the substrate. A conductive region 106 is formed using a conductive material or doped silicon over the substrate, and part thereof serves as a source and a drain of the reading transistor. Part of the conductive region 106 serves as part of the bias line $S_m$. There is a region in which adjacent conductive regions 106 are separated from each other by a gate electrode 111 of the reading transistor. A first connection electrode 110 is provided over part of the conductive region 106. For materials of the gate electrode 111 and the first connection electrode 110, Embodiment 3 may be referred to.

The degree of integration is increased in such a manner that the first connection electrode 110 or the bias line $S_m$ is shared by a memory cell and an adjacent memory cell as illustrated in the drawing. In the semiconductor memory device illustrated in FIGS. 17A to 17D, given that the minimum feature size is F, the area per memory cell is $16.5F^2$.

Figure 17B:
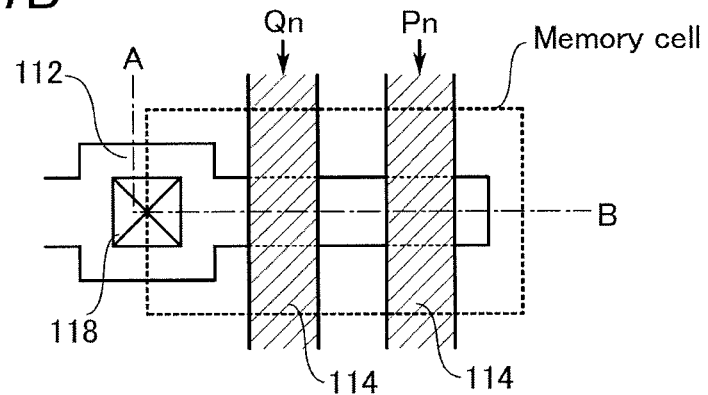

Main wirings, main electrodes, and the like, focusing on the transistor including an oxide semiconductor which is formed over the circuit illustrated in FIG. 17A, are illustrated in FIG. 17B. A plurality of island-shaped oxide semiconductor regions 112 and a plurality of first wirings 114 are formed. The first wirings 114 serve as a writing word line $Q_n$ and a reading word line $P_n$.

Part of the first wiring 114 overlaps with the oxide semiconductor and serves as the gate electrode of the writing transistor. The oxide semiconductor region 112 is in contact with the gate electrode 111 in a lower layer. A capacitor is formed in a portion where part of the first wiring 114 overlaps with the gate electrode 111. Further, a second connection electrode 118 is provided over part of the oxide semiconductor region 112 in order to connect the oxide semiconductor region 112 to an upper layer (e.g., a bit line $R_m$).

Figure 17C:
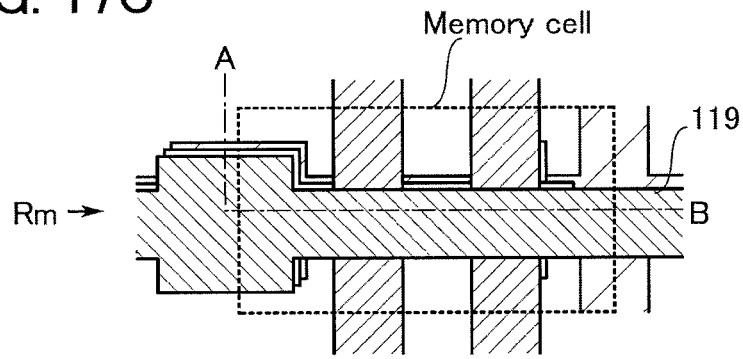
Figure 17D:
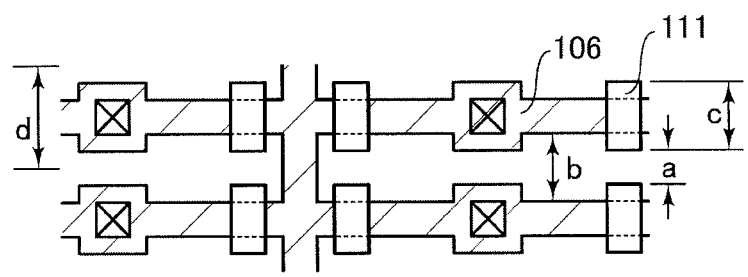

FIG. 17C illustrates a state in which the structure in FIG. 17A overlaps with the structure in FIG. 17B. Note that a dot A and a dot B indicate the same positions throughout FIGS. 17A to 17C. In FIG. 17C, the structures are shifted a little from each other so as to see the overlap. In addition, a second wiring 119 formed over the transistor including an oxide semiconductor is also illustrated in FIG. 17C. The second wiring 119 forms the bit line $R_m$.

In FIGS. 17A to 17D, the width of the conductive region 106, the width of the first wiring 114, and the like each have the minimum feature size F. That is, the line width and the line interval are F. In that case, the size of the memory cell is $16.5F^2$.

Embodiment 5

In this embodiment, an example of operation of the semiconductor memory device illustrated in FIG. 2A will be described with reference to FIGS. 3A to 3F. Note that specific values of potentials are given below for the purpose of aid for understanding a technical idea of the present invention. Needless to say, such values are changed in accordance with various characteristics of a transistor, a capacitor, or the like, or for convenience of the practitioner. Further, the semiconductor memory device illustrated in FIG. 2A can write or read data using a method other than a method described below.

Here, the writing transistors $WTr1_{(n,m)}$ and $WTr2_{(n,m)}$ and the reading transistors $RTr1_{(n,m)}$ and $RTr2_{(n,m)}$ are all n-channel transistors. The writing transistors $WTr1_{(n,m)}$ and $WTr2_{(n,m)}$ and the reading transistors $RTr1_{(n,m)}$ and $RTr2_{(n,m)}$ are turned on when the potential of the gate therein becomes higher than the potential of either the source or the drain therein by 1 V or more, and the writing transistors $WTr1_{(n,m)}$ and $WTr2_{(n,m)}$ and the reading transistors $RTr1_{(n,m)}$ and $RTr2_{(n,m)}$ are in an off state under the other conditions.

A portion of the gate capacitance of the reading transistors $RTr1_{(n,m)}$ and $RTr2_{(n,m)}$, which fluctuates depending on the gate bias, is negligibly small as compared to the capacitances of the capacitors $C1_{(n,m)}$ and $C2_{(n,m)}$. Further, the parasitic capacitance of the writing transistors $WTr1_{(n,m)}$ and $WTr2_{(n,m)}$, the parasitic capacitance of the reading transistors $RTr1_{(n,m)}$ and $RTr2_{(n,m)}$, the parasitic capacitance generated between wirings, and the like, which are not illustrated in the drawings, are assumed to be 0. In FIGS. 3A to 3F, a circle on a transistor indicates that the transistor is in an on state, and a cross mark on a transistor indicates that the transistor is in an off state. As for a transistor which is turned on under a specific condition, notes are added in the drawings.

Figure 3A:
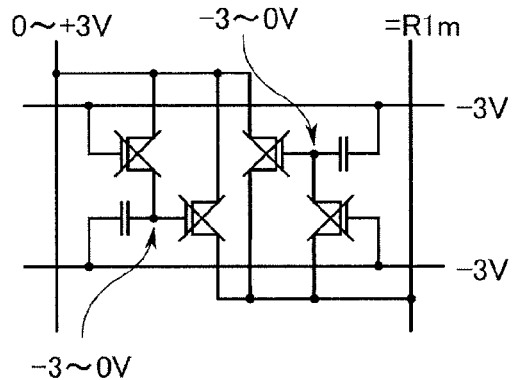
FIGS. 3A to 3F illustrate an example of a driving method of a semiconductor memory device of the present invention.

First, a writing method will be described. At the time of writing, it is assumed that the potential of the bit line $R1_m$ and the potential of the bit line $R2_m$ are set equal. When writing is performed in a row other than the row of the memory unit, as illustrated in FIG. 3A, the potentials of the word lines $Q1_n$ and $Q2_n$ are set to −3 V. The potentials of the bit lines $R1_m$ and $R2_m$ are set to one of four levels of 0 V, +1 V, +2 V, and +3 V in accordance with data to be written in the memory cell on which writing is performed.

In this state, the potentials of a node $F1_{(n,m)}$ and a node $F2_{(n,m)}$ are set higher than or equal to −3 V and lower than or equal to 0 V. Under such conditions, the writing transistors $WTr1_{(n,m)}$ and $WTr2_{(n,m)}$ and the reading transistors $RTr1_{(n,m)}$ and $RTr2_{(n,m)}$ are each in an off state.

Figure 3B:
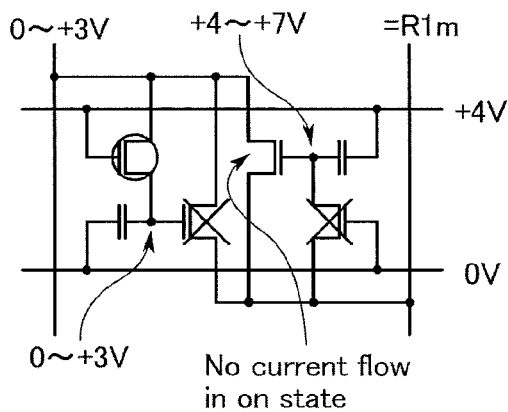

Next, data is written to a memory cell. First, as illustrated in FIG. 3B, the potential of the bit line $R1_m$ is set to 0 V, +1 V, +2 V, or +3 V, in accordance with data to be written. The potential of the bit line $R2_m$ is equal to the potential of the bit line $R1_m$. Further, the potential of the word line $Q1_n$ and the potential of the word line $Q2_n$ are set to +4 V and 0 V, respectively, so that the writing transistor $WTr1_{(n,m)}$ is turned on and the potential of the node $F1_{(n,m)}$ becomes close to the potential of the bit line $R1_m$. Here, the potential of the node $F1_{(n,m)}$ is assumed to become equal to the potential of the bit line $R1_m$.

At this time, the writing transistor $WTr2_{(n,m)}$ is in an off state. The reading transistor $RTr1_{(n,m)}$ is also in an off state because the potentials of the gate, the source, and the drain are equal. Meanwhile, the potential of the node $F2_{(n,m)}$ increases by +7 V and becomes higher than or equal to +4 V and lower than or equal to +7 V in response to an increase in the potential of the word line $Q1_n$ from −3 V to +4 V. Accordingly, the reading transistor $RTr2_{(n,m)}$ is turned on, but the potential of the source (i.e., the bit line $R2_m$) is equal to the potential of the drain (i.e., the bit line $R1_m$) and current does not flow between the source and the drain.

Next, the potential of the word line $Q1_n$ is set to 0 V, so that the writing transistor $WTr1_{(n,m)}$ is turned off and the potential of the node $F1_{(n,m)}$ is kept at the potential of the bit line $R1_m$ and writing of data is completed.

Figure 3C:
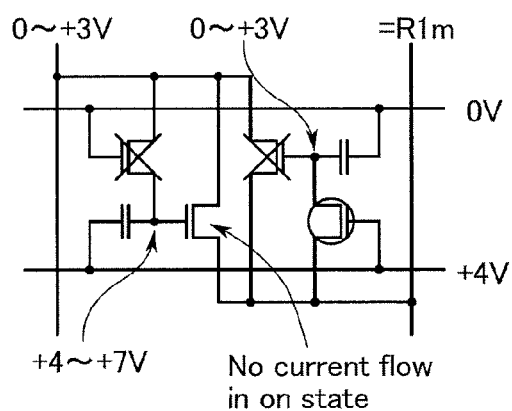

Next, data is written to the other memory cell. As illustrated in FIG. 3C, the potential of the bit line $R1_m$ is set to 0 V, +1 V, +2 V, or +3 V, in accordance with data to be written. The potential of the bit line $R2_m$ is equal to the potential of the bit line $R1_m$. Here, the potential of the word line $Q2_n$ is set to +4 V, so that the potential of the node $F1_{(n,m)}$ increases by +4 V and becomes higher than or equal to +4 V and lower than or equal to +7 V. At this time, the writing transistor $WTr2_{(n,m)}$ is turned on, and the potential of the node $F2_{(n,m)}$ becomes equal to the potential of the bit line $R2_m$.

At this time, the reading transistor $RTr1_{(n,m)}$ and the writing transistor $WTr1_{(n,m)}$ are in an off state. Although the reading transistor $RTr2_{(n,m)}$ is on, the potential of the source (i.e., the bit line $R2_m$) is equal to the potential of the drain (i.e., the bit line $R1_m$) and current does not flow between the source and the drain. Then, the potential of the word line $Q2_n$ is set to 0 V. In this manner, writing of data to the other memory cell is completed.

Next, a reading method will be described. In the following description, although data is read from the memory cell on the left in the memory unit of FIG. 2A, the data can be read from the memory cell on the right in a similar manner.

In the case where reading is performed in a row other than the row of the memory unit, as illustrated in FIG. 3A, the potentials of the word lines $Q1_n$ and $Q2_n$ are set to −3 V. In this manner, the writing transistors $WTr1_{(n,m)}$ and $WTr2_{(n,m)}$ are turned off.

The potentials of the node $F1_{(n,m)}$ and the node $F2_{(n,m)}$ are higher than or equal to −3 V and lower than or equal to 0 V. Since the potentials of the bit lines $R1_m$ and $R2_m$ are higher than or equal to 0 V and lower than or equal to +3 V as described later, the reading transistors $RTr1_{(n,m)}$ and $RTr2_{(n,m)}$ can remain in an off state.

Figure 3D:
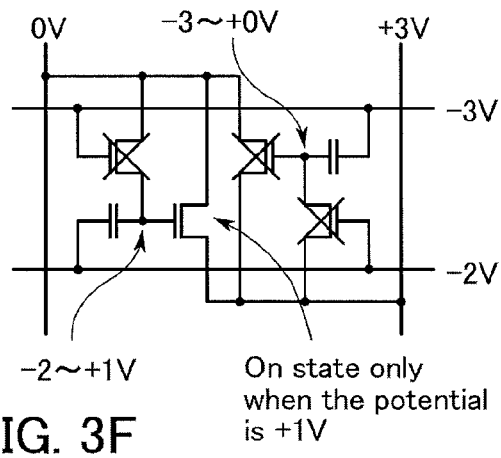

Next, reading of the memory cell is performed. As illustrated in FIG. 3D, the potentials of the word lines $Q1_n$ and $Q2_n$ are set to −3 V and −2 V, respectively. In addition, the potentials of the bit lines $R1_m$ and $R2_m$ are set to 0 V and +3 V, respectively. At this time, the writing transistors $WTr1_{(n,m)}$ and $WTr2_{(n,m)}$ remain in an off state. The potential of the node $F2_{(n,m)}$ is higher than or equal to −3 V and lower than or equal to 0 V, and the reading transistor $RTr2_{(n,m)}$ remains in an off state.

The potential of the node $F1_{(n,m)}$ is higher than or equal to −2 V and lower than or equal to +1 V. The potential of the node $F1_{(n,m)}$ is the potential of the gate of the reading transistor $RTr1_{(n,m)}$, and if the potential of the node $F1_{(n,m)}$ is +1 V, the reading transistor $RTr1_{(n,m)}$ is turned on. Then, current flows between the bit lines $R1_m$ and $R2_m$.

If a capacitor is provided at an end portion of the bit line $R1_m$, in the case where current flows between the bit lines $R1_m$ and $R2_m$ the potential of the bit line $R1_m$ (the initial potential: 0 V) becomes close to the potential (+3 V) of the bit line $R2_m$. The potential of the bit line $R1_m$ is finally determined in accordance with the potential of the node $F1_{(n,m)}$. In any case, the potential of the bit line $R1_m$ is changed within a range of higher than or equal to 0 V and lower than or equal to +3 V.

At this time, the potential of the node $F1_{(n,m)}$ becomes +1 V in the case where the potential of the bit line $R1_m$ is +3 V at the time of writing. In other words, if the reading transistor $RTr1_{(n,m)}$ is on when the potential of the word line $Q2_n$ is set to −2 V, it can be found that the potential of the bit line $R1_m$ at the time of writing is +3 V. In this manner, the value of the held data can be found.

Figure 3E:
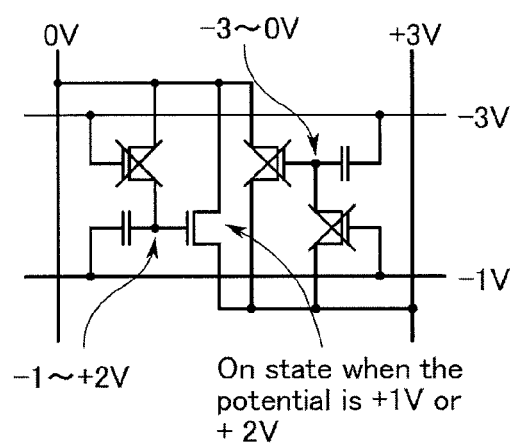

Further, the potential of the word line $Q2_n$ is increased to −1 V as illustrated in FIG. 3E, whereby the potential of the node becomes −1 V, 0 V, +1 V, or +2 V in accordance with the written data. If the potential of the node $F1_{(n,m)}$ is +1 V or +2 V, the reading transistor $RTr1_{(n,m)}$ is on and current flows between the bit lines $R1_m$ and $R2_m$.

The value of data can be found by detection of the current. At this time, the potential of the node $F1_{(n,m)}$ is +1 V or +2 V in the case where the potential of the bit line $R1_m$ is +2 V or +3 V at the time of writing. If the reading transistor $RTr1_{(n,m)}$ which is off when the potential of the word line $Q2_n$ is −2 V (i.e., the state of FIG. 3D) is turned on when the potential of the word line $Q2_n$ becomes −1 V, it can be found that the potential of the bit line $R1_m$ at the time of writing is +2 V.

Figure 3F:
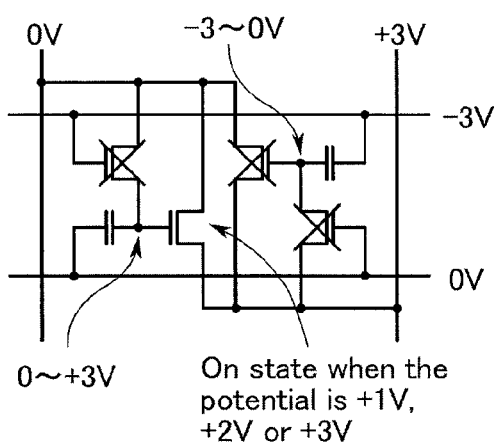

Similarly, when the potential of the word line $Q2_n$ is increased to 0 V as illustrated in FIG. 3F, the potential of the node $F1_{(n,m)}$ becomes 0 V, +1 V, +2 V, or +3 V in accordance with the written data. If the potential of the node $F1_{(n,m)}$ is +1 V, +2 V, or +3 V here, the reading transistor $RTr1_{(n,m)}$ is on and current flows between the bit lines $R1_m$ and $R2_m$. That is, the reading transistor $RTr1_{(n,m)}$ is on at this time if the potential of the bit line $R1_m$ is +1 V, +2 V, or +3 V at the time of writing.

In the case where the potential of the bit line at the time of writing is 0 V, when the potential of the word line $Q2_n$ is set to 0 V, the potential of the node $F1_{(n,m)}$ is 0 V and the reading transistor $RTr1_{(n,m)}$ is still in an off state. That is, in the case where current does not flow between the bit lines $R1_m$ and $R2_m$ even when the potential of the word line $Q2_n$ is 0 V, it is found that the potential of the bit line $R1_m$ at the time of writing is 0 V.

The above described is the method for obtaining the value of data by changing the potential of the word line $Q2_n$ in stages; however, the value of data can also be obtained by measurement of a potential in a manner similar to that described in Embodiment 1.

In the above-described manner, the four-level (two-bit) data can be written and read. Needless to say, much more data such as eight-level (three-bit) data or sixteen-level (four-bit) data can be written and read similarly. Alternatively, two-level (one-bit) data can be written and read.

Figure 2A:
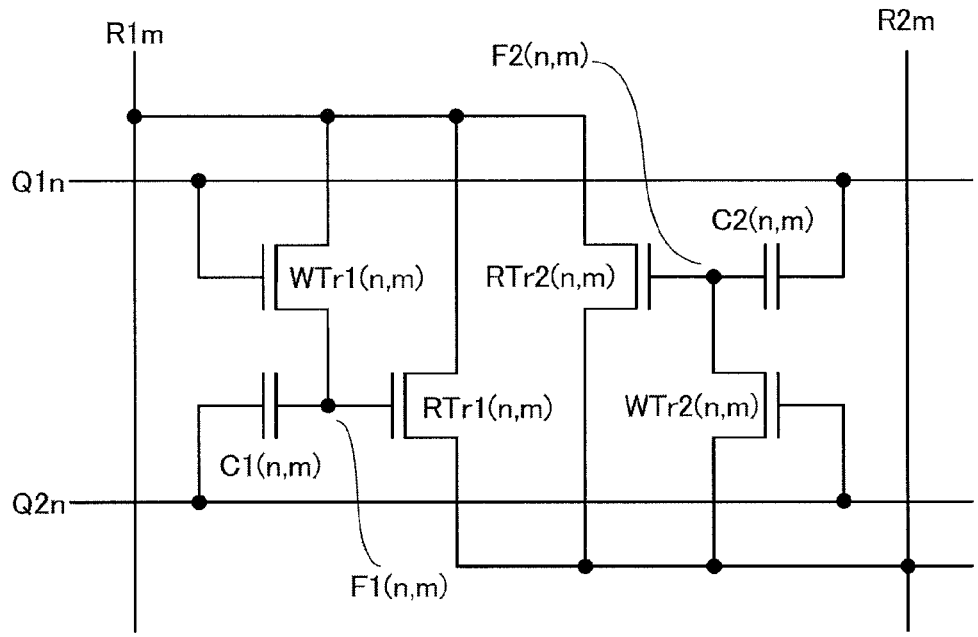
FIGS. 2A and 2B illustrate an example of a semiconductor memory device of the present invention.
Figure 2B:
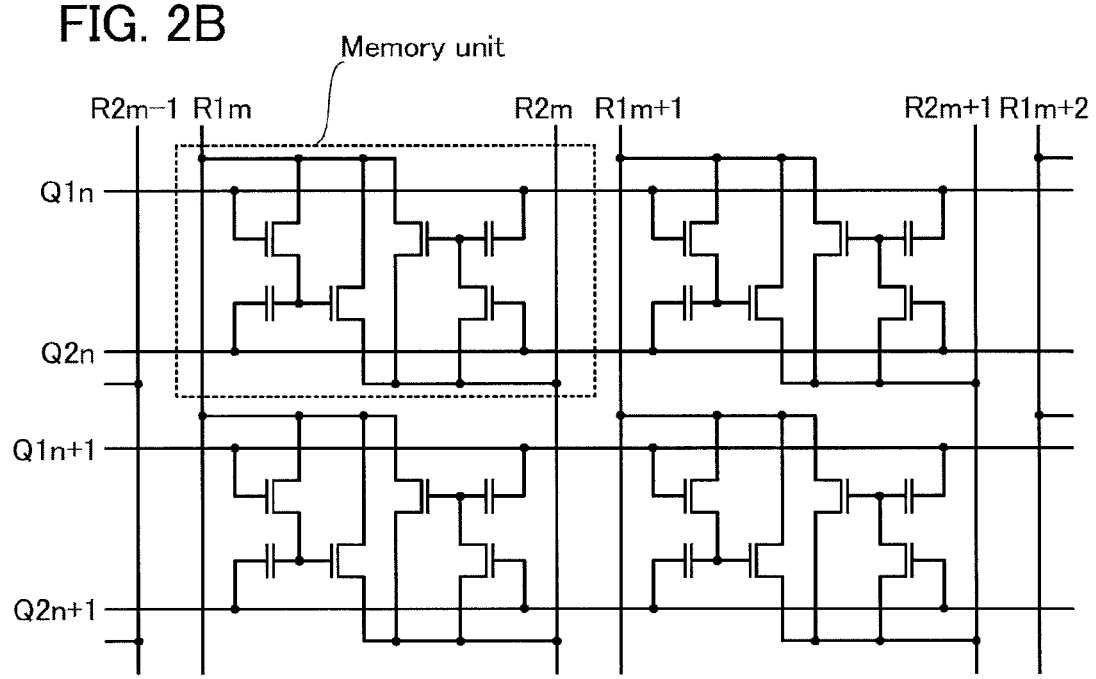
Figure 4A:
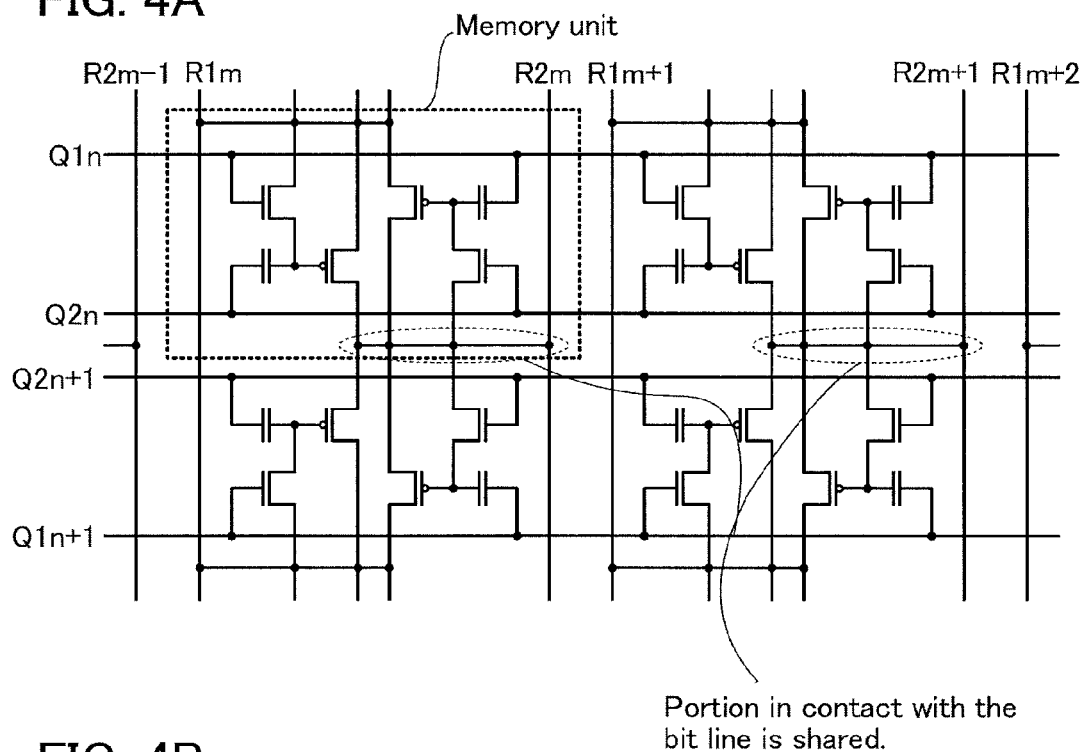
FIGS. 4A and 4B illustrate an example of a semiconductor memory device of the present invention.

The difference between the semiconductor memory device illustrated in FIG. 4A and the semiconductor memory device illustrated in FIG. 2A is only whether the portion in contact with the bit line is shared or not. Therefore, the semiconductor memory device illustrated in FIG. 4A can also be operated using the method described in this embodiment. Needless to say, the semiconductor memory device illustrated in FIG. 4A can also be operated using a method other than the method described in this embodiment.

In the above description, although the parasitic capacitance and the gate capacitances of the reading transistors $RTr1_{(n,m)}$ and $RTr1_{(n,m)}$ are much smaller than the capacitances of the capacitors $C1_{(n,m)}$ and $C2_{(n,m)}$ and ignored, potentials to be applied need to be determined in view of these capacitances in an actual memory cell.

The gate capacitances of the reading transistors $RTr1_{(n,m)}$ and $RTr2_{(n,m)}$ greatly fluctuate between an on state and an off state; therefore, the potentials of the gates of the reading transistors $RTr1_{(n,m)}$ and $RTr2_{(n,m)}$ are influenced by the fluctuation. As the ratio of the gate capacitances of the reading transistors $RTr1_{(n,m)}$ and $RTr2_{(n,m)}$ to the capacitances of the capacitors and $C2_{(n,m)}$ are higher, the influence is bigger. Accordingly, the capacitances of the capacitors $C1_{(n,m)}$ and $C2_{(n,m)}$ are preferably larger than or equal to twice as large as the gate capacitances of the reading transistors $RTr1_{(n,m)}$ and $RTr2_{(n,m)}$.

Embodiment 6

Figure 8A:
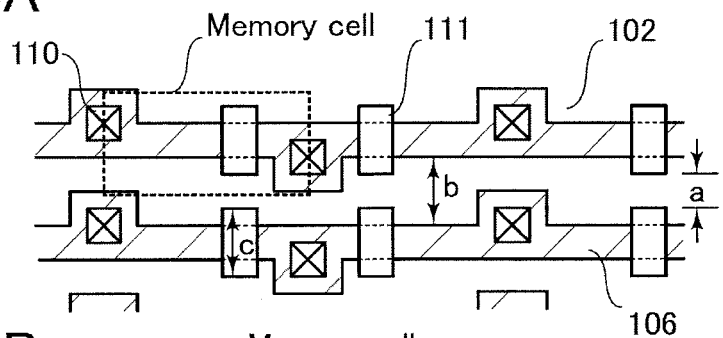
FIGS. 8A to 8D illustrate an example of layout and the like of wirings in a semiconductor memory device of the present invention.

In this embodiment, the shape of the semiconductor memory device will be described with reference to FIGS. 8A to 8D. FIG. 8A illustrates main wirings, main electrodes, and the like provided over a single crystal silicon substrate of the semiconductor memory device described in Embodiment 3. FIG. 5A focuses on one memory cell, while FIG. 8A illustrates memory cells so as to show a relation between the memory cells. In FIG. 8A, the distance a is a distance between the gate electrodes 111, the distance b is a distance between the conductive regions 106, and the length c is a length of the gate electrode 111; these distances and the length are important in determining the size of the memory cell.

There are some factors determining the degree of integration of the semiconductor device having a matrix structure. One is the length c of the gate electrode. The gate electrode 111 needs to surely cross the conductive region 106. Since the width of the conductive region 106 has a minimum feature size (F), the length c of the gate electrode 111 needs to be twice (2F) as large as the minimum feature size. In addition, since the gate electrode 111 needs to be apart from the adjacent gate electrode 111, the distance a between the gate electrodes 111 needs to be larger than or equal to the minimum feature size (F). Accordingly, the distance b between the conductive regions 106 needs to be twice (2F) as large as the minimum feature size.

When the distance a between the gate electrodes 111, the distance b between the conductive regions 106, and the length c of the gate electrode 111 are minimized, the degree of integration is the highest, and as described in Embodiment 3, the area per memory cell can be $18F^2$. However, in such a case, the bit line and the bias line need to be formed using separate wiring layers (i.e., the first wiring 114 and the second wiring 119) as illustrated in FIGS. 5A to 5D and FIGS. 7A to 7C. This leads to an increase in the number of steps and a decrease in yield accompanying the increase in the number of steps.

In this embodiment, described is a case in which when the number of steps is suppressed at the expense of the degree of integration by particularly setting the distance b between the conductive regions 106 to an appropriate value, another effect can be obtained. For high degree of integration, the distance b between the conductive regions 106 is preferably 2F, but is set to 3F in this embodiment. Of course the degree of integration is decreased in accordance with the increase in the distance b between the conductive regions 106 by F. In the semiconductor memory device illustrated in FIGS. 8B to 8D, the area per memory cell is $24F^2$, which is 1.33 times as large as that of FIG. 8A. However, another effect which is enough to make up the decrease in the degree of integration can be expected.

With the increase in the distance b between the conductive regions 106 by F, other lengths and structures can be changed. Specifically, part of the conductive regions 106 is expanded and the portion in contact with the bit line is moved in a direction opposite to the portion in contact with the bias line by the length F. In addition, the length c of the gate electrode is increased by F, by utilizing the increase in the distance between the conductive regions 106.

The former change enables formation of the bit line and the bias line using the same wiring layer, and the latter change can make the capacitance of the capacitor be 1.5 times as large as that of FIG. 8A. Details thereof will be described below. The semiconductor memory device described in this embodiment can be formed using the method described in Embodiment 3 although having a wiring pattern or the like which is different from that of Embodiment 3.

Figure 8B:
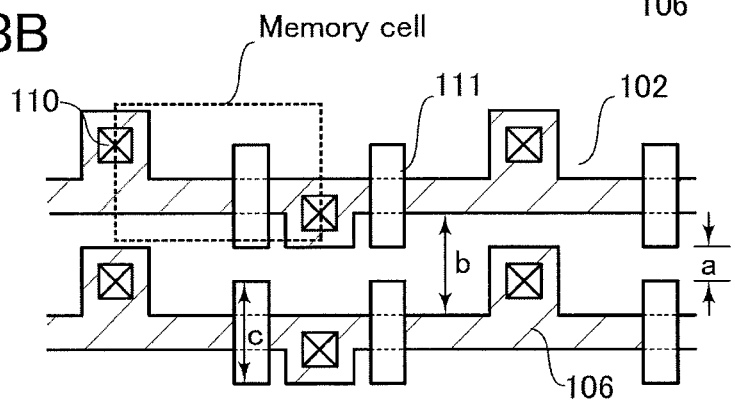

FIG. 8B illustrates main wirings, main electrodes, and the like provided over a single crystal silicon substrate. The wirings and the electrodes are almost the same as those in Embodiment 3 or in FIG. 8A. One different point is that part of the conductive regions is expanded in an upper direction in the drawing by the length F. Utilizing this, the portion in contact with the bit line R is moved in the upper direction in the drawing by the length F.

Another different point is that the length of the gate electrode 111 is extended in both the upper direction and the lower direction each by 0.5F. That is, the length c of the gate electrode is 2F in FIGS. 8A and 3F in FIG. 8B. This means that the capacitance of the capacitor C becomes 1.5 times as large as that of FIG. 8A.

As pointed out in Embodiment 1, the capacitance of the capacitor C is preferably larger than the gate capacitance of the reading transistor Rtr. Therefore, the increase in the capacitance is suitable for this purpose. Note that the data holding time is basically the value obtained by multiplying the resistance in an off state of the writing transistor WTr by the capacitance of the capacitor C. Therefore, the increase in the capacitance of the capacitor C has an effect of increasing the data holding time.

Figure 8C:
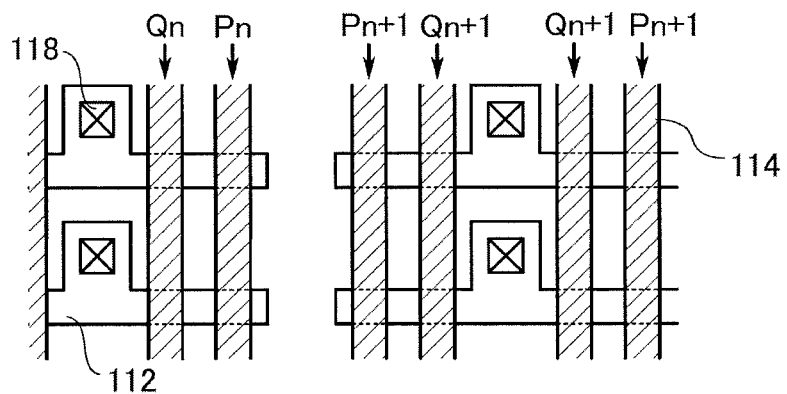

FIG. 8C illustrates main wirings, main electrodes, and the like, focusing on the transistor including an oxide semiconductor which is formed over the circuit illustrated in FIG. 8B. In a manner similar to that of Embodiment 3, a plurality of island-shaped oxide semiconductor regions 112, a plurality of first wirings 114, and a plurality of second connection electrodes 118 are formed. The first wirings 114 are disposed so as to overlap with the gate electrodes 111. The positions of the oxide semiconductor regions 112, the first wirings 114, and the second connection electrodes 118 are determined in accordance with the layout of FIG. 8B.

Figure 8D:
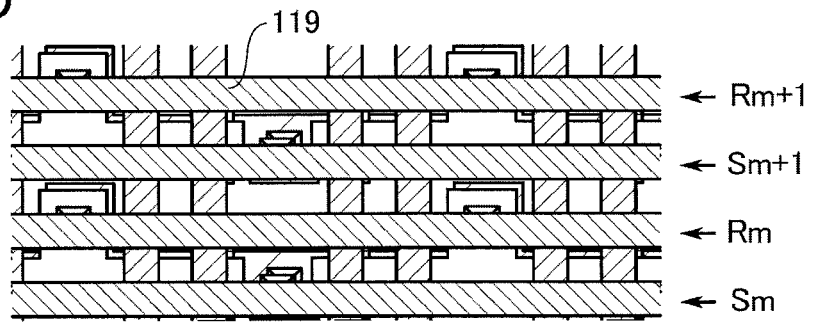

FIG. 8D illustrates a state in which the structure in FIG. 8B overlaps with the structure in FIG. 8C. In FIG. 8D, the structures are shifted a little from each other so as to see the overlap. In addition, a second wiring 119 formed over the transistors including an oxide semiconductor is also illustrated in FIG. 8D. The second wiring 119 forms bit lines $R_m$ and $R_{m+1}$ and bias lines $S_m$ and $S_{m+1}$. In other words, the bit lines and the bias lines can be formed using the same wiring layer. This is because the distance between the bit lines and the bias lines can be increased as a result of the increase in the distance b between the conductive regions 106.

As described above, the degree of integration is decreased and the area per unit cell becomes 1.33 times, but at the same time, the capacitance C of the capacitor becomes 1.5 times. In addition, the bit lines and the bias lines can be formed using the same wiring layer.

Embodiment 7

In this embodiment, the shape of another semiconductor memory device will be described. FIGS. 9A to 9D illustrate an example of layout of a memory unit of the semiconductor memory device of this embodiment. The semiconductor memory device described in this embodiment can be manufactured using the method described in Embodiment 3 although having a wiring pattern or the like which is different from that of Embodiment 3. The semiconductor memory device described in this embodiment has a circuit configuration corresponding to the circuit diagram illustrated in FIG. 4A.

Figure 9A:
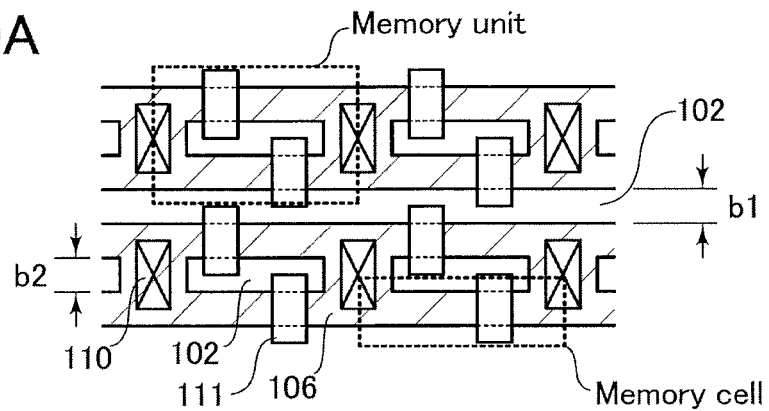
FIGS. 9A to 9D illustrate an example of layout and the like of wirings in a semiconductor memory device of the present invention.

In FIG. 9A, main wirings, main electrodes, and the like provided over a single crystal silicon substrate are illustrated. The element separation regions 102 are formed over the substrate. The conductive regions 106 are formed using a conductive material or doped silicon. There is a region in which adjacent conductive regions 106 are separated from each other by the gate electrode 111 of the reading transistor.

The first connection electrodes 110 are provided over part of the conductive regions 106. As materials of the gate electrodes 111 and the first connection electrodes 110, the materials which satisfy conditions for the gate electrode 111 and the first connection electrode 110, which are described in Embodiment 3, may be used. As is seen from FIG. 9A, the conductive regions 106 each have the first connection electrode 110 in the center and are separated from each other by the gate electrode 111; therefore, the conductive regions 106 each have a distorted H-shape (or I-shape).

In this embodiment, as illustrated in the drawing, a region of the conductive region, over which the first connection electrode 110 is formed, is wider than that of FIG. 5A; accordingly, the area of a portion used for the first connection electrode 110 can be increased. The area used for the first connection electrode 110 in FIG. 9A is twice that of FIG. 5A. By thus increasing the area of the connection electrode, bonding with a wiring or the like in an upper layer can be surely performed, so that a decrease in yield due to defective connection can be prevented.

As illustrated in the drawing, a memory unit is located between two first connection electrodes 110 and includes one element separation region 102 surrounded by the conductive regions 106 and two gate electrodes 111. Further, each memory unit includes two memory cells.

A feature of this embodiment is that the gates 111 are disposed in a staggered configuration. As a result, the gate electrodes 111 can be disposed at a higher density as compared to the density of the semiconductor memory device having the structure illustrated in FIG. 5A or FIG. 8A. In the semiconductor memory device having the structure illustrated in FIG. 8A, the gate electrodes 111 are disposed in one straight line and therefore the distance a between the gate electrodes 111 needs to be the minimum feature size (F). Accordingly, the distance b between the adjacent conductive regions 106 needs to be at least twice (2F) as large as the minimum feature size.

However, since the gate electrodes 111 are disposed in a staggered configuration in this embodiment, the value corresponding to the distance a can be 0, and the value corresponding to the distance b (b1 and b2 in FIG. 9A) can be one time (F) of the minimum feature size. Therefore, the area per memory cell can be $12F^2$.

In the layout illustrated in this specification, generous alignment margin is provided. In a design rule in which the margin is made as small as possible, the area per memory cell of the semiconductor memory device based on the principle described in this embodiment can be reduced to $8F^2$.

In this embodiment, there are two different types of distances between the conductive regions 106: a distance b1 between the conductive regions 106 between the memory units and a distance b2 between the conductive regions 106 inside the memory unit. By controlling the distances b1 and b2 independently, effects can be obtained from the respective distances. In order to reduce the area per memory cell, each of the distance b1 and the distance b2 may be the minimum feature size F.

Figure 9B:
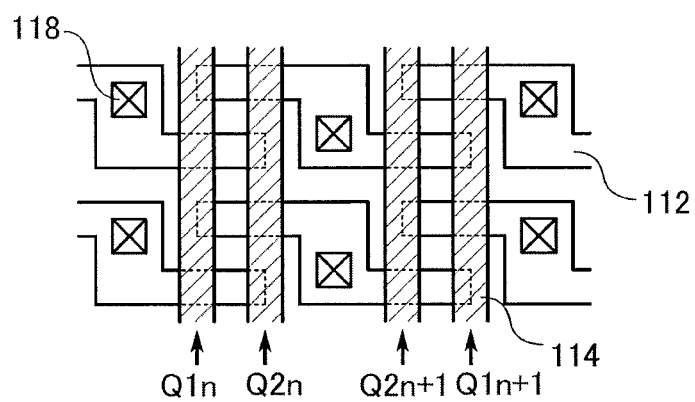

FIG. 9B illustrates main wirings, main electrodes, and the like, focusing on the transistor including an oxide semiconductor which is formed over the circuit illustrated in FIG. 9A. A plurality of island-shaped oxide semiconductor regions 112 and a plurality of first wirings 114 are formed. The first wirings 114 serve as word lines $Q1_n$, $Q2_n$, $Q1_{n+1}$, $Q2_{n+1}$, and the like and are disposed so as to overlap with the gate electrodes 111.

Part of the first wirings 114 overlaps with the oxide semiconductor and serves as gate electrodes of the writing transistors. The oxide semiconductor regions 112 are in contact with the gate electrodes 111 in the lower layer. Further, capacitors are formed in portions where parts of the first wirings 114 overlap with the gate electrodes 111. Second connection electrodes 118 for connecting to an upper layer (e.g., a bit line $R_m$) are provided over the oxide semiconductor regions 112. The shape of the oxide semiconductor regions 112 is, like the shape of the conductive regions 106, twofold symmetric, that is, when the oxide semiconductor region is rotated by 180°, the shape overlaps with the original shape, and is not line-symmetric.

Figure 9C:
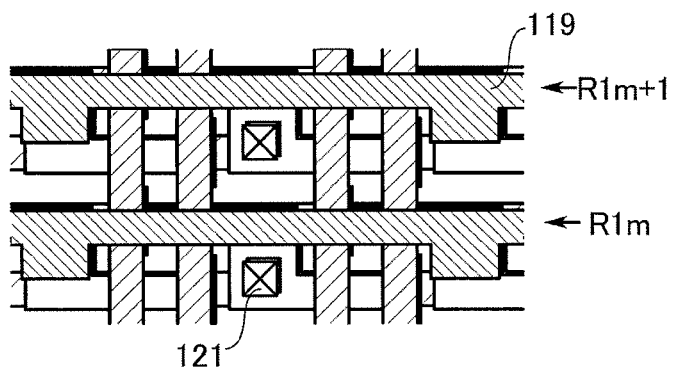

FIG. 9C illustrates a state in which the structure in FIG. 9A overlaps with the structure in FIG. 9B and second wirings 119 are formed over the transistors including an oxide semiconductor. In FIG. 9C, the structures are shifted a little from each other so as to see the overlap. The second wirings 119 form bit lines R1. Third connection electrodes 121 are provided so as to overlap with the second connection electrodes 118 for further connection to an upper layer (e.g., a bit line R2).

Figure 9D:
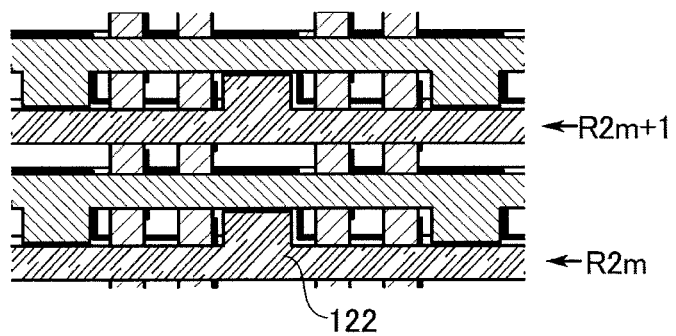

FIG. 9D illustrates a state in which a third wiring 122 is provided over the second wirings 119. The third wiring 122 forms the bit line R2.

Embodiment 8

Figure 10A:
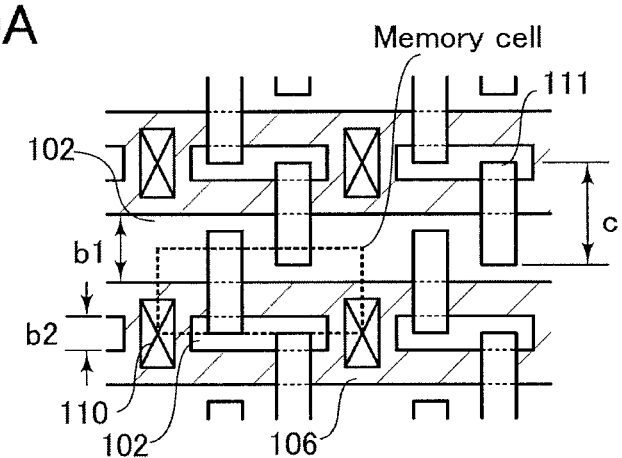
FIGS. 10A to 10C illustrate an example of layout and the like of wirings in a semiconductor memory device of the present invention.
Figure 10B:
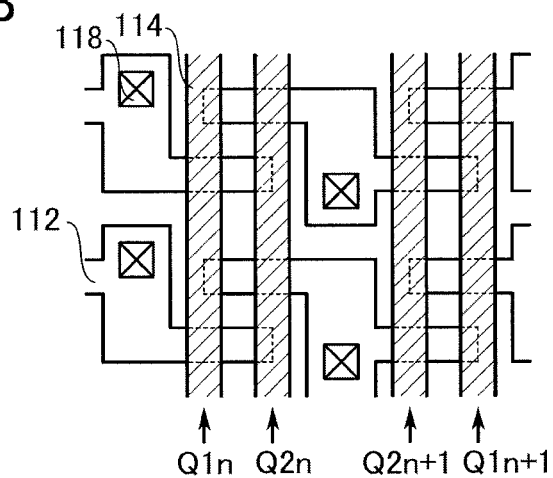
Figure 10C:
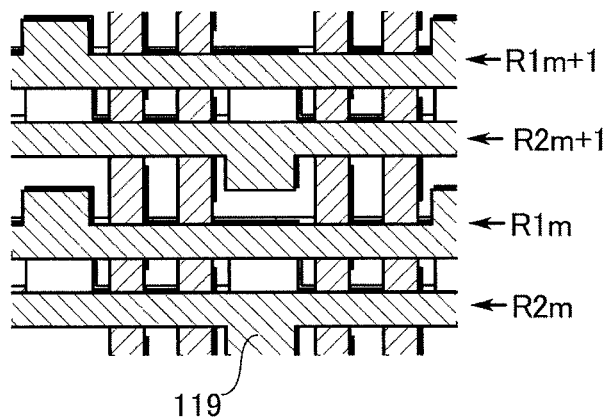

In this embodiment, the shape of still another semiconductor memory device will be described. In this embodiment, an effect obtained by setting the distance b1 and the distance b2 between the conductive regions 106 illustrated in FIG. 9A to different values from each other will be described. FIGS. 10A to 10C illustrate an example of layout of a memory unit of the semiconductor memory device of this embodiment. The semiconductor memory device described in this embodiment can be manufactured using the method described in Embodiment 3 although having a wiring pattern or the like which is different from that of Embodiment 3. The semiconductor memory device described in this embodiment has a circuit configuration corresponding to the circuit diagram illustrated in FIG. 4A.

In FIG. 10A, main wirings, main electrodes, and the like provided over a single crystal silicon substrate are illustrated. The element separation regions 102 are formed over the substrate. The conductive regions 106 are formed using a conductive material or doped silicon. There is a region in which adjacent conductive regions 106 are separated from each other by the gate electrode 111 of the reading transistor.

The first connection electrodes 110 are provided over parts of the conductive regions 106. As materials of the gate electrodes 111 and the first connection electrodes 110, the materials which satisfy conditions for the gate electrode 111 and the first connection electrode 110, which are described in Embodiment 3, may be used. Also in this embodiment in a similar manner to that of Embodiment 7, the memory unit is located between two first connection electrodes 110 and includes one element separation region 102 surrounded by the conductive regions 106 and two gate electrodes 111. Further, each memory unit includes two memory cells.

A feature of this embodiment is that in addition to the structure in which the gate electrodes 111 are disposed in a staggered configuration, the distance b1 between the conductive regions 106 between the memory units is set larger than the distance b2 between the conductive regions 106 inside the memory unit. Here, the distance b1 is set to twice (2F) the minimum feature size. As a result, the degree of integration is decreased as compared to that of the semiconductor memory device having the structure illustrated in FIGS. 9A to 9D, while the length c of the gate electrodes 111 can be set larger.

In the semiconductor memory device illustrated in FIGS. 10A to 10C, the area per memory cell is $15F^2$, which is larger than that ($12F^2$) of the semiconductor memory device illustrated in FIGS. 9A to 9D but smaller than that ($18F^2$) of the semiconductor memory device illustrated in FIGS. 5A to 5D.

Further, the lengths of the gate electrodes are 3F, whereby the capacitance of the capacitor can become 1.5 times as large as that of the semiconductor memory device illustrated in FIGS. 5A to 5D. Thus, the semiconductor memory device described in this embodiment can obtain two effects which are the decrease in the area per memory cell and the increase in the capacitance of the capacitor.

In order to evaluate how much the two mutually contradictory needs, which are the decrease in the area per memory cell and the increase in the capacitance of the capacitor, are satisfied, the value obtained by dividing the area of the capacitor by the area per a memory cell (i.e., the capacitor/memory cell area ratio) may be compared. It is preferable that this value is higher.

The values of the semiconductor memory device illustrated in FIGS. 5A to 5D and the semiconductor memory device described in Embodiment 6 are 0.11 and 0.125, respectively, and the value of the semiconductor memory device illustrated in FIGS. 9A to 9D is 0.17. Meanwhile, the value of the semiconductor memory device illustrated in FIGS. 10A to 10C is 0.2. That is, the semiconductor memory device illustrated in FIGS. 10A to 10C is inferior to the semiconductor memory device illustrated in FIGS. 9A to 9D in the degree of integration, but is superior to the semiconductor memory device illustrated in FIGS. 9A to 9D in the capacitor/memory cell area ratio.

FIG. 10B illustrates main wirings, main electrodes, and the like, focusing on the transistor including an oxide semiconductor which is formed over the circuit illustrated in FIG. 10A. A plurality of island-shaped oxide semiconductor regions 112 and a plurality of first wirings 114 are formed. The first wirings 114 serve as word lines $Q1_n$, $Q2_n$, $Q1_{n+1}$, $Q2_{n+1}$, and the like. Second connection electrodes 118 for connecting to an upper layer (e.g., a bit line) are provided over the oxide semiconductor regions 112.

FIG. 10C illustrates a state in which the structure in FIG. 10A overlaps with the structure in FIG. 10B. In FIG. 10C, the structures are shifted a little from each other so as to see the overlap. In addition, a second wiring 119 formed over the transistors including an oxide semiconductor is also illustrated in FIG. 10C. The second wiring 119 forms bit lines $R1_m$, $R2_m$, $R1_{m+1}$, and $R2_{m+1}$, and the like.

In this embodiment, the area per a memory cell is increased as compared to that of the semiconductor memory device illustrated in FIGS. 9A to 9D. This allows more bit lines to be formed in the same layer. Therefore, for example, the bit lines in the semiconductor memory device illustrated in FIG. 2A can be fanned in the same layer. Accordingly, the number of steps can be reduced.

Furthermore, as illustrated in FIG. 10C, the area of portions of the second wiring 119, which are in contact with the second connection electrodes 118, can be wider than that of FIG. 8D. This is effective in suppressing the decrease in yield due to defective contact.

Embodiment 9

In this embodiment, an example of operation of the semiconductor memory device illustrated in FIG. 12A will be described with reference to FIGS. 13A to 13F. Note that specific values of potentials are given below for the purpose of aid for understanding a technical idea of the present invention. Needless to say, such values are changed in accordance with various characteristics of a transistor, a capacitor, or the like, or for convenience of the practitioner. Further, the semiconductor memory device illustrated in FIG. 12A can write or read data using a method other than a method described below.

Here, the writing transistors $WTr1_{(n,m)}$ and $WTr2_{(n,m)}$ are n-channel transistors, and the reading transistors $RTr1_{(n,m)}$ and $RTr2_{(n,m)}$ are p-channel transistors. The writing transistors are turned on when the potential of the gate therein becomes higher than the potential of either the source or the drain therein by 1 V or more, and the writing transistors are in an off state under the other conditions. The reading transistors are turned on when the potential of the gate therein becomes lower than the potential of either the source or the drain by 1 V or more, and the reading transistors are in an off state under the other conditions.

A portion of the gate capacitance of the reading transistors $RTr1_{(n,m)}$ and $RTr2_{(n,m)}$, which fluctuates depending on the gate bias, is negligibly small as compared to the capacitances of the capacitors $C1_{(n,m)}$ and $C2_{(n,m)}$. Further, the parasitic capacitance of the writing transistors $WTr1_{(n,m)}$ and $WTr2_{(n,m)}$ the parasitic capacitance of the reading transistors $RTr1_{(n,m)}$ and $RTr2_{(n,m)}$, the parasitic capacitance generated between wirings, and the like, which are not illustrated in the drawings, are assumed to be 0. In FIGS. 13A to 13F, a circle on a transistor indicates that the transistor is in an on state, and a cross mark on a transistor indicates that the transistor is in an off state. As for a transistor which is turned on under a specific condition, notes are added in the drawings.

Figure 13A:
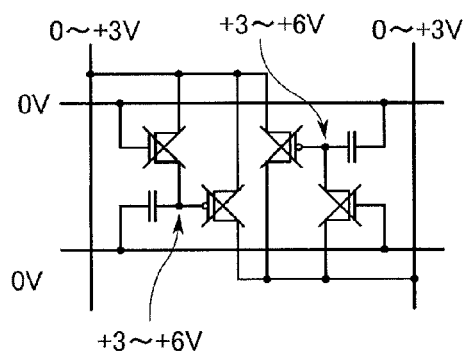
FIGS. 13A to 13F illustrate an example of a driving method of a semiconductor memory device of the present invention.

First, a writing method will be described. When writing is performed in a row other than the row of the memory unit, as illustrated in FIG. 13A, the potentials of the word lines $Q1_n$ and $Q2_n$ are set to 0 V. The potentials of the bit lines $R1_m$ and $R2_m$ are set to one of four levels of 0 V, +1 V, +2 V, and +3 V in accordance with data to be written in the memory cell on which writing is performed. In this state, the potentials of the nodes $F1_{(n,m)}$ and $F2_{(n,m)}$ are set higher than or equal to +3 V and lower than or equal to +6 V. Under such conditions, the writing transistors $WTr1_{(n,m)}$ and $WTr2_{(n,m)}$ and the reading transistors $RTr1_{(n,m)}$ and $RTr2_{(n,m)}$ are each in an off state.

Figure 13B:
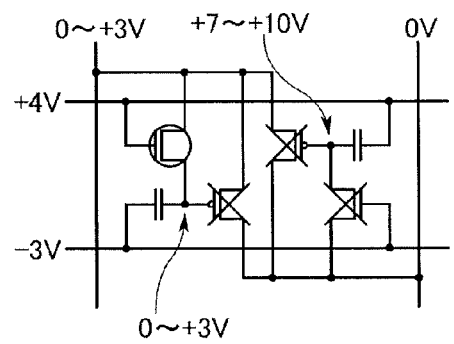

Next, data is written to a memory cell. First, as illustrated in FIG. 13B, the potential of the bit line $R1_m$ is set to 0 V, +1 V, +2 V, or +3 V, in accordance with data to be written. The potential of the bit line $R2_m$ is set to 0 V. Further, the potential of the word line $Q1_n$ and the potential of the word line $Q2_n$ are set to +4 V and −3 V, respectively, so that the writing transistor $WTr1_{(n,m)}$ is turned on and the potential of the node $F1_{(n,m)}$ becomes close to the potential of the bit line $R1_m$. Here, the potential of the node $F1_{(n,m)}$ is assumed to become equal to the potential of the bit line $R1_m$.

At this time, the reading transistors $RTr1_{(n,m)}$ and $RTr2_{(n,m)}$ and the writing transistor $WTr2_{(n,m)}$ are in an off state. Meanwhile, the potential of the node $F2_{(n,m)}$ increases by +4 V and becomes higher than or equal to +7 V and lower than or equal to +10 V in response to an increase in the potential of the word line $Q1_n$ from 0 V to +4 V.

Next, the potential of the word line $Q1_n$ is set to −3 V, so that the writing transistor $WTr1_{(n,m)}$ is turned off and the potential of the node $F1_{(n,m)}$ is kept at the potential of the bit line $R1_m$ and writing of data is completed.

Figure 13C:
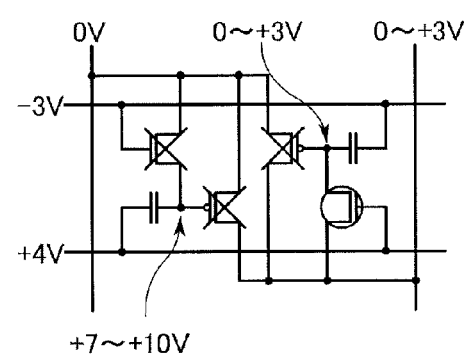

Next, data is written to the other memory cell. As illustrated in FIG. 13C, the potential of the bit line $R2_m$ is set to 0 V, +1 V, +2 V, or +3 V, in accordance with data to be written. The potential of the bit line $R1_m$ is set to 0V. Here, the potential of the word line $Q2_n$ is set to +4 V, so that the potential of the node $F1_{(n,m)}$ increases by +4 V and becomes higher than or equal to +7 V and lower than or equal to +10 V. At this time, the writing transistor $WTr2_{(n,m)}$ is turned on, and the potential of the node $F2_{(n,m)}$ becomes equal to the potential of the bit line $R2_m$.

At this time, the reading transistors $RTr1_{(n,m)}$ and $RTr2_{(n,m)}$ and the writing transistor $WTr1_{(n,m)}$ are in an off state. Then, the potential of the word line $Q2_n$ is set to −3 V. In this manner, writing of data to the other memory cell is completed.

Next, a reading method will be described. In the following description, although data is read from the memory cell on the left in the memory unit of FIG. 12A, the data can be read from the memory cell on the right in a similar manner.

In the case where reading is performed in a row other than the row of the memory unit, as illustrated in FIG. 13A, the potentials of the word lines $Q1_n$ and $Q2_n$ are set to 0 V. In this manner, the writing transistors $WTr1_{(n,m)}$ and $WTr2_{(n,m)}$ are turned off.

The potentials of the node $F1_{(n,m)}$ and the node $F2_{(n,m)}$ are higher than or equal to +3 V and lower than or equal to +6 V. Since the potentials of the bit lines $R1_m$ and $R2_m$ are higher than or equal to 0 V and lower than or equal to +3 V as described later, the reading transistors $RTr1_{(n,m)}$ and $RTr2_{(n,m)}$ can remain in an off state.

Figure 13D:
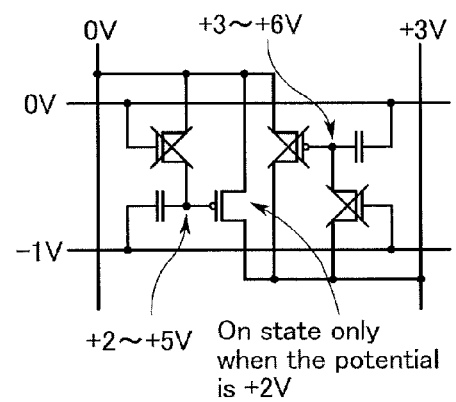

Next, reading of the memory cell is performed. As illustrated in FIG. 13D, the potentials of the word lines $Q1_n$ and $Q2_n$ are set to 0 V and −1 V, respectively. In addition, the potentials of the bit lines $R1_m$ and $R2_m$ are set to 0 V and +3 V, respectively. At this time, the writing transistors $WTr1_{(n,m)}$ and $WTr2_{(n,m)}$ remain in an off state. The potential of the node $F2_{(n,m)}$ is higher than or equal to +3 V and lower than or equal to +6 V, and the reading transistor $RTr2_{(n,m)}$ remains in an off state.

The potential of the node $F1_{(n,m)}$ is higher than or equal to +2 V and lower than or equal to +5 V. The potential of the node $F1_{(n,m)}$ is the potential of the gate of the reading transistor $RTr1_{(n,m)}$, and if the potential of the node $F1_{(n,m)}$ is +2 V, the reading transistor $RTr1_{(n,m)}$ is turned on. Then, current flows between the bit lines $R1_m$ and $R2_m$.

If a capacitor is provided at an end portion of the bit line $R2_m$, in the case where current flows between the bit lines $R1_m$ and $R2_m$, the potential of the bit line $R2_m$ (the initial potential: +3 V) becomes close to the potential (0 V) of the bit line $R1_m$. The potential of the bit line $R2_m$ is finally determined in accordance with the potential of the node $F1_{(n,m)}$. In any case, the potential of the bit line $R2_m$ is changed within a range of higher than or equal to 0 V and lower than or equal to +3 V.

At this time, the potential of the node becomes +2 V in the case where the potential of the bit line $R1_m$ is 0 V at the time of writing. In other words, if the reading transistor $RTr1_{(n,m)}$ is on when the potential of the word line $Q2_n$ is set to −1 V, it can be found that the potential of the bit line $R1_m$ at the time of writing is 0 V. In this manner, the value of the held data can be found.

Figure 13E:
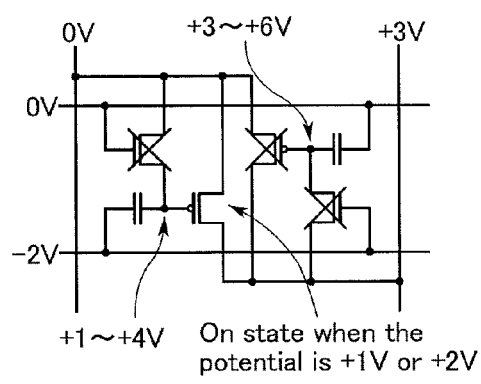
Figure 13F:
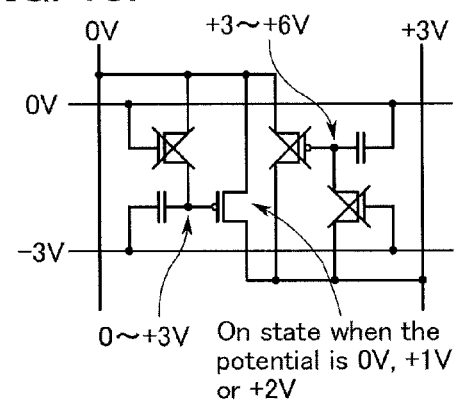

Further, the potential of the word line $Q2_n$ is decreased to −2 V as illustrated in FIG. 13E, whereby the potential of the node $F1_{(n,m)}$ becomes +1 V, +2 V, +3 V, or +4 V in accordance with the written data. If the potential of the node $F1_{(n,m)}$ is +1 V or +2 V, the reading transistor $RTr1_{(n,m)}$ is on and current flows between the bit lines $R1_m$ and $R2_m$.

The value of data can be found by detection of the current. At this time, the potential of the node $F1_{(n,m)}$ is +1 V or +2 V in the case where the potential of the bit line $R1_m$ is 0 V or +1 V at the time of writing. If the reading transistor $RTr1_{(n,m)}$ which is off when the potential of the word line $Q2_n$ is −1 V (i.e., the state of FIG. 3D) is turned on when the potential of the word line $Q2_n$ becomes −2 V, it can be found that the potential of the bit line $R1_m$ at the time of writing is +1 V.

Similarly, when the potential of the word line $Q2_n$ is decreased to −3 V as illustrated in FIG. 3F, the potential of the node $F1_{(n,m)}$ becomes 0 V, +1 V, +2 V, or +3 V in accordance with the written data. If the potential of the node $F1_{(n,m)}$ is 0 V, +1 V, or +2 V here, the reading transistor $RTr1_{(n,m)}$ is on and current flows between the bit lines $R1_m$ and $R2_m$. That is, the reading transistor $RTr1_{(n,m)}$ is on at this time if the potential of the bit line $R1_m$ is 0 V, +1 V, or +2 V at the time of writing.

In the case where the potential of the bit line at the time of writing is +3 V, when the potential of the word line $Q2_n$ is set to −3 V, the potential of the node $F1_{(n,m)}$ is +3 V and the reading transistor $RTr1_{(n,m)}$ is still in an off state. That is, in the case where current does not flow between the bit lines $R1_m$ and $R2_m$ even when the potential of the word line $Q2_n$ is −3 V, it is found that the potential of the bit line $R1_m$ at the time of writing is +3 V.

The above described is the method for obtaining the value of data by changing the potential of the word line $Q2_n$ in stages; however, the value of data can also be obtained by measurement of a potential in a manner similar to that described in Embodiment 1.

In the above-described manner, the four-level (two-bit) data can be written and read. Needless to say, much more data such as eight-level (three-bit) data or sixteen-level (four-bit) data can be written and read similarly. Alternatively, two-level (one-bit) data can be written and read.

Figure 12A:
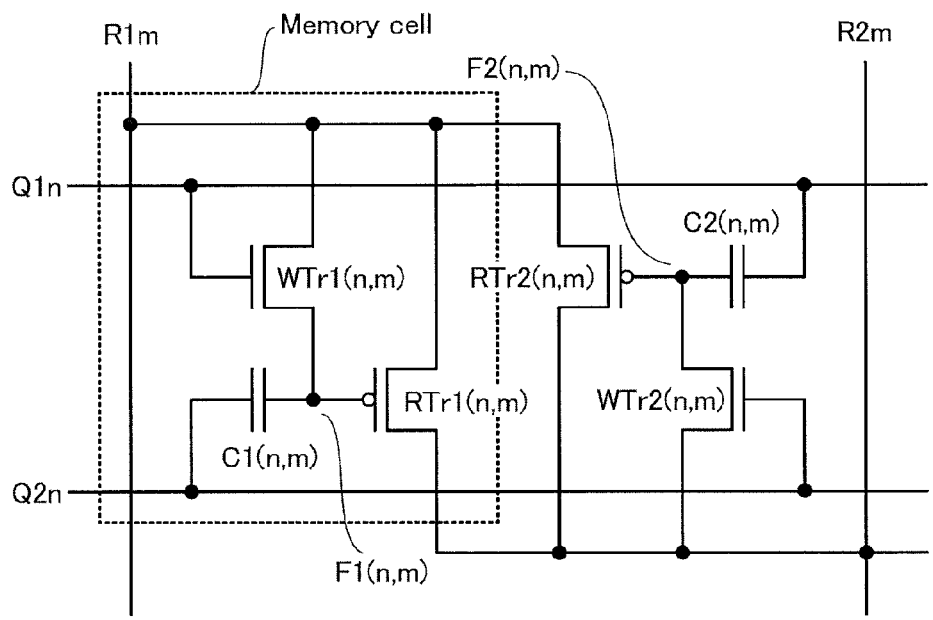
FIGS. 12A and 12B illustrate an example of a semiconductor memory device of the present invention.
Figure 12B:
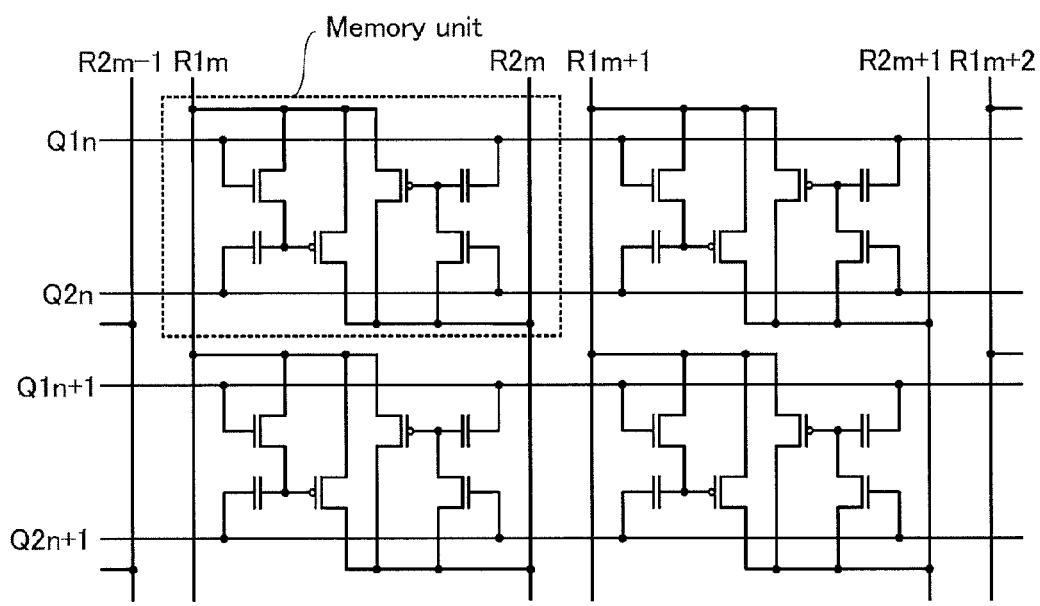

The difference between the semiconductor memory device illustrated in FIG. 4A and the semiconductor memory device illustrated in FIG. 12A is only whether the portion in contact with the bit line is shared or not. Therefore, the semiconductor memory device illustrated in FIG. 4A can also be operated using the method described in this embodiment. Needless to say, the semiconductor memory device illustrated in FIG. 4A can also be operated using a method other than the method described in this embodiment.

In the above description, although the parasitic capacitance and the gate capacitances of the reading transistors $RTr1_{(n,m)}$ and $RTr1_{(n,m)}$ are much smaller than the capacitances of the capacitors $C1_{(n,m)}$ and $C2_{(n,m)}$ and ignored, potentials to be applied need to be determined in view of these capacitances in an actual memory cell.

The gate capacitances of the reading transistors $RTr1_{(n,m)}$ and $RTr2_{(n,m)}$ greatly fluctuate between an on state and an off state; therefore, the potentials of the gates of the reading transistors $RTr1_{(n,m)}$ and $RTr2_{(n,m)}$ are influenced by the fluctuation. As the ratio of the gate capacitances of the reading transistors $RTr1_{(n,m)}$ and $RTr2_{(n,m)}$ to the capacitances of the capacitors $C1_{(n,m)}$ and $C2_{(n,m)}$ are higher, the influence is bigger. Accordingly, the capacitances of the capacitors $C1_{(n,m)}$ and $C2_{(n,m)}$ are preferably larger than or equal to twice as large as the gate capacitances of the reading transistors $RTr1_{(n,m)}$ and $RTr2_{(n,m)}$.

Embodiment 10

Figure 4B:
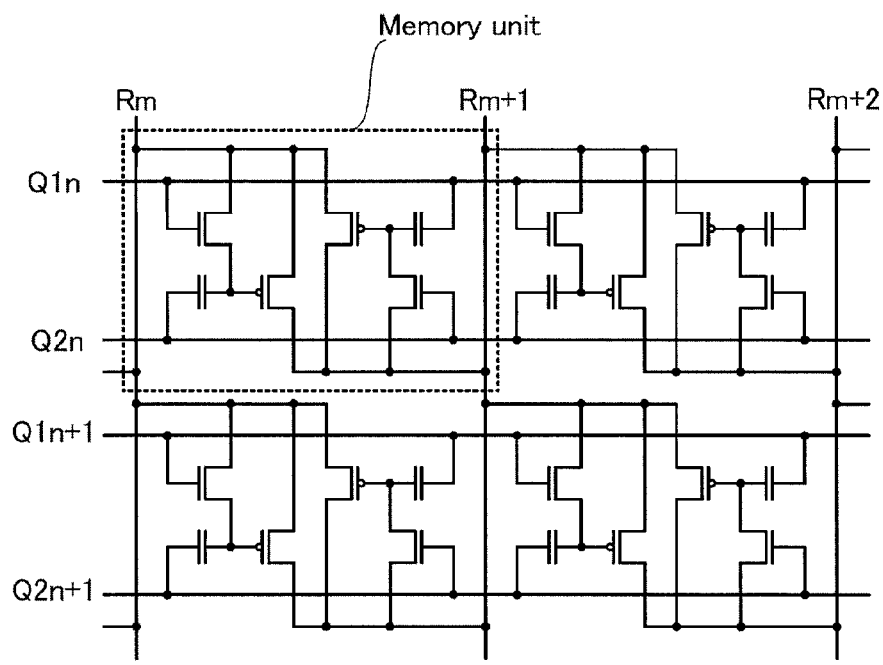

In this embodiment, an example of operation of the semiconductor memory device illustrated in FIG. 4B will be described with reference to FIGS. 15A to 15C and FIGS. 16A to 16C. Note that specific values of potentials are given below for the purpose of aid for understanding a technical idea of the present invention. Needless to say, such values are changed in accordance with various characteristics of a transistor, a capacitor, or the like, or for convenience of the practitioner. Further, the semiconductor memory device illustrated in FIG. 4B can write or read data using a method other than a method described below.

Here, a writing method and a reading method in the memory unit in the n-th row and m-th column and the memory unit in the n-th row and (m+1)-th column which are adjacent to each other in the semiconductor memory device illustrated in FIG. 4B will be described. Writing and reading can be performed also in the other memory units in a similar operation.

In this embodiment, writing transistors $WTr1_{(n,m)}$, $WTr1_{(n,m)}$, and $WTr2_{(n,m)}$ are n-channel transistors, and reading transistors $RTr1_{(n,m)}$, $RTr1_{(n,m)}$, and $RTr2_{(n,m)}$ are p-channel transistors. The writing transistors are turned on when the potential of the gate therein becomes higher than the potential of either the source or the drain therein by 2 V or more, and the writing transistors are in an off state under the other conditions. The reading transistors are turned on when the potential of the gate therein becomes lower than the potential of either the source or the drain therein by 2 V or more, and the reading transistors are in an off state under the other conditions.

A portion of the gate capacitance of the reading transistors $RTr1_{(n,m)}$, $RTr2_{(n,m)}$, $RTr1_{(n,m)}$, and $RTr2_{(n,m)}$, which fluctuates depending on the gate bias, is negligibly small as compared to the capacitances of capacitors $C1_{(n,m)}$, $C2_{(n,m)}$, $C1_{(n,m+1)}$, and $C2_{(n,m+1)}$.

Further, the parasitic capacitance of the writing transistors $WTr1_{(n,m+1)}$, $WTr2_{(n,m+1)}$, $WTr1_{(n,m+1)}$, and $WTr2_{(n,m+1)}$, the parasitic capacitance of the reading transistors $RTr1_{(n,m)}$, $RTr2_{(n,m)}$, $RTr1_{(n,m+1)}$, and $RTr2_{(n,m+1)}$, the parasitic capacitance generated between wirings, and the like, which are not illustrated in the drawings, are assumed to be 0.

In FIGS. 15A to 15C and FIGS. 16A to 16C, a circle on a transistor indicates that the transistor is in an on state, and a cross mark on a transistor indicates that the transistor is in an off state. As for a transistor which is turned on under a specific condition, notes are added in the drawings.

Figure 15A:
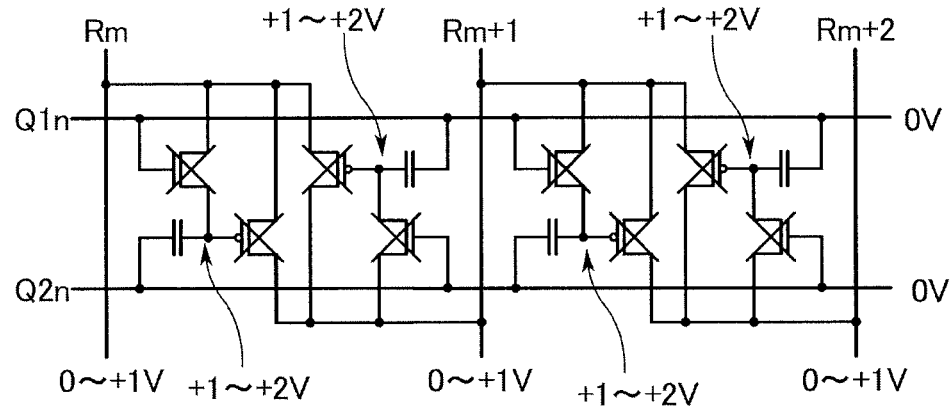
FIGS. 15A to 15C illustrate an example of a driving method (writing) of a semiconductor memory device of the present invention.

First, a writing method will be described. When writing is performed in a row other than the row of the memory units, as illustrated in FIG. 15A, the potentials of the word lines $Q1_n$ and $Q2_n$ are set to 0 V. The potentials of the bit lines $R_m$, $R_{m+1}$, and $R_{m+2}$ are set to one of two levels of 0 V and +1 V in accordance with data to be written in the memory cells on which writing is performed.

In this state, the potentials of a node $F1_{(n,m)}$, a node $F2_{(n,m)}$, a node $F1_{(n,m+1)}$, and a node $F2_{(n,m+1)}$ are set higher than or equal to +1 V and lower than or equal to +2 V. Under such conditions, the writing transistors $WTr1_{(n,m)}$, $WTr2_{(n,m)}$, $WTr1_{(n,m+1)}$, and $WTr2_{(n,m+1)}$ and the reading transistors $RTr1_{(n,m+1)}$, $RTr2_{(n,m+1)}$, $RTr1_{(n,m+1)}$, and $RTr2_{(n,m+1)}$ are each in an off state.

Figure 15B:
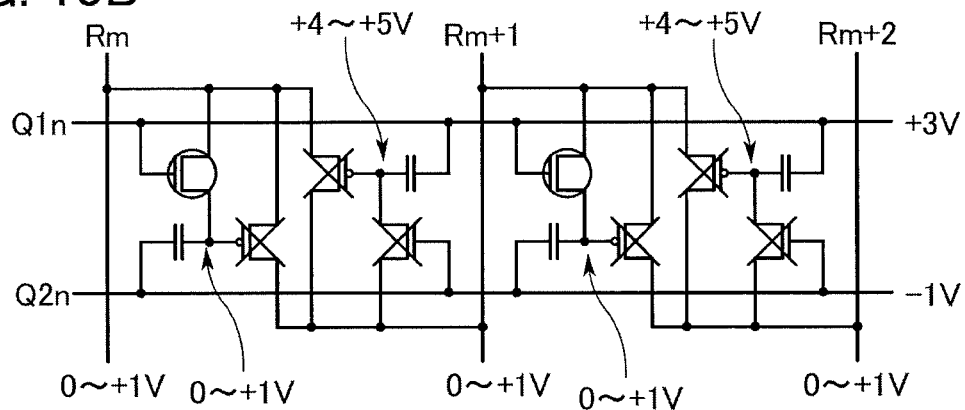

Next, data is written to the memory units. First, as illustrated in FIG. 15B, the potentials of the bit lines $R_m$, $R_{m+1}$, and $R_{m+2}$ are set to 0 V or +1 V in accordance with data to be written. Further, the potential of the word line $Q1_n$ and the potential of the word line $Q2_n$ are set to +3 V and −1 V, respectively, so that the writing transistors $WTr1_{(n,m)}$ and $WTr1_{(n,m)}$ are turned on and the potentials of the node $F1_{(n,m)}$ and the node $F1_{(n,m+1)}$ become close to the potentials of the bit lines $R_m$ and $R_{m+1}$, respectively. Here, the potentials of the node $F1_{(n,m)}$ and the node $F1_{(n,m+1)}$ are assumed to become equal to the potentials of the bit lines $R_m$ and $R_{m+1}$, respectively.

At this time, the reading transistors $RTr1_{(n,m)}$, $RTr2_{(n,m)}$, $RTr1_{(n,m+1)}$, and $RTr2_{(n,m+1)}$ and the writing transistors $WTr2_{(n,m)}$ and $WTr2_{(n,m+1)}$ are in an off state. The potential of the node $F2_{(n,m)}$ increases by +3 V and becomes higher than or equal to +4 V and lower than or equal to +5 V in response to an increase in the potential of the word line $Q1_n$ from 0 V to +3 V.

Next, the potential of the word line $Q1_n$ is set to −1 V, so that the writing transistors $WTr1_{(n,m)}$ and $WTr1_{(n,m+1)}$ are turned off and the potentials of the node $F1_{(n,m)}$ and the node $F1_{(n,m+1)}$ are kept at the potentials of the bit lines $R_m$ and $R_{m+1}$, respectively. Thus, data is written.

Figure 15C:
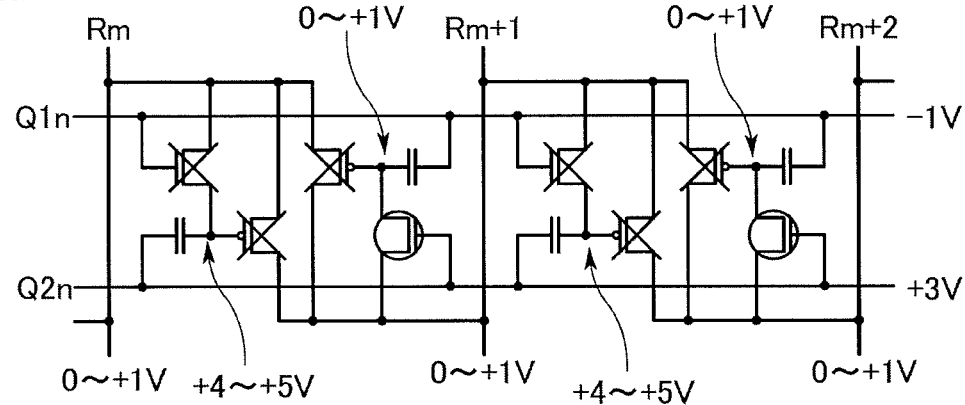

Next, data is written to the other memory cell in each of the memory units. As illustrated in FIG. 15C, the potentials of the bit lines $R_m$, $R_{m+1}$, and $R_{m+2}$ are set to 0 V or +1 V in accordance with data to be written.

Here, the potential of the word line $Q2_n$ is set to +3 V, so that the potential of the node $F1_{(n,m)}$ increases by +3 V and becomes higher than or equal to +4 V and lower than or equal to +5 V. At this time, the writing transistors $WTr2_{(n,m)}$ and $WTr2_{(n,m+1)}$ are turned on, and the potentials of the node $F2_{(n,m)}$ and the node $F2_{(n,m+1)}$ become equal to the potentials of the bit lines $R_{m+1}$ and $R_{m+2}$, respectively.

At this time, the reading transistors $RTr1_{(n,m)}$, $RTr2_{(n,m)}$, $RTr1_{(n,m+1)}$, and $RTr2_{(n,m+1)}$ and the writing transistors $WTr1_{(n,m)}$ and $WTr1_{(n,m+1)}$ are in an off state. Then, the potential of the word line $Q2_n$ is set to −1 V. In this manner, writing of data to the other memory cells is completed.

Next, a reading method will be described. In the following description, although data is read from the memory cells on the left in the memory units of FIG. 4B, the data can be read from the memory cells on the right in a similar manner.

Figure 16A:
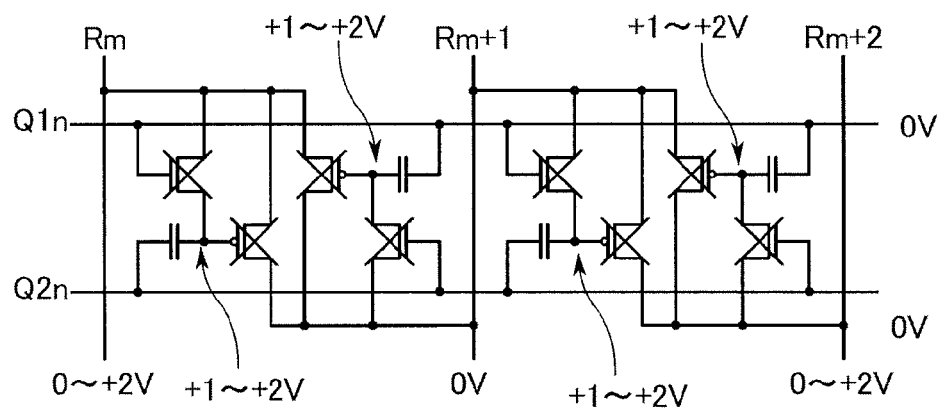
FIGS. 16A to 16C illustrate an example of a driving method (reading) of a semiconductor memory device of the present invention.

First, the potential of the bit line $R_{m+1}$ is set to 0 V. In other words, the potentials of bit lines in every other line are set to 0 V. In the case where reading is performed in this state in a row other than the row of the memory units, as illustrated in FIG. 16A, the potentials of the word lines $Q1_n$ and $Q2_n$ are set to 0 V.

In this manner, the writing transistors $WTr1_{(n,m)}$ and $WTr2_{(n,m)}$ are turned off. The potentials of the node $F1_{(n,m)}$, the node $F2_{(n,m)}$, the node $F1_{(n,m+1)}$, and the node $F2_{(n,m+1)}$ are higher than or equal to +1 V and lower than or equal to +2 V. Since the potentials of the bit lines $R_m$ and $R_{m+1}$ are higher than or equal to 0 V and lower than or equal to +2 V as described later, the reading transistors $RTr1_{(n,m)}$, $RTr2_{(n,m)}$, $RTr1_{(n,m+1)}$, $RTr2_{(n,m+1)}$ can remain in an off state.

Figure 16B:
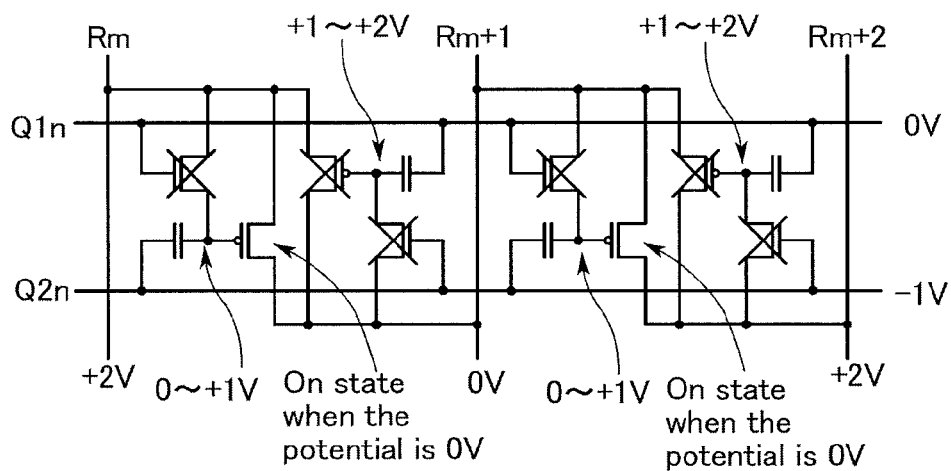

Next, reading of the memory cells is performed. As illustrated in FIG. 16B, the potentials of the word lines $Q1_n$ and $Q2_n$ are set to 0 V and −1 V, respectively. In addition, the potentials of the bit lines $R_m$ and $R_{m+2}$ are set to +2 V. At this time, the writing transistors $WTr1_{(n,m)}$, $WTr2_{(n,m)}$, $WTr2_{(n,m+1)}$ remain in an off state. The potentials of the node $F2_{(n,m)}$ and the node $F2_{(n,m+1)}$ are higher than or equal to +1 V and lower than or equal to +2 V, and the reading transistors $RTr2_{(n,m)}$ and $RTr2_{(n,m+1)}$ remain in an off state.

The potentials of the node $F_{(n,m)}$ and the node $F1_{(n,m+1)}$ are higher than or equal to 0 V and lower than or equal to +1 V. The potentials of the node $F1_{(n,m)}$ and the node $F1_{(n,m+1)}$ are the potentials of the gates of the reading transistors $RTr1_{(n,m)}$ and $RTr1_{(n,m+1)}$, respectively, and if the potential of the node $F1_{(n,m)}$ is 0 V, the reading transistor $RTr1_{(n,m)}$ is turned on. Similarly, if the potential of the node $F1_{(n,m+1)}$ is 0 V, the reading transistor $RTr1_{(n,m+1)}$ is turned on. Then, current flows between the bit lines $R_m$ and $R_{m+1}$ or between the bit lines $R_{m+1}$ and $R_{m+2}$.

If a capacitor is provided at an end portion of the bit line $R_m$ (or the bit line $R_{m+2}$), in the case where current flows between the bit lines $R_m$ and $R_{m+1}$ (or between the bit lines $R_{m+1}$ and $R_{m+2}$), the potential of the bit line $R_m$ (the initial potential: +2 V) becomes close to the potential (0 V) of the bit line $R_{m+1}$. The potential of the bit line $R_m$ is finally determined in accordance with the potential of the node $F1_{(n,m)}$ (or the node $F1_{(n,m+1)}$. In any case, the potential of the bit line $R_m$, (or the bit line $R_{m+2}$) is changed within a range of higher than or equal to 0 V and lower than or equal to +2 V.

At this time, the potential of the node $F1_{(n,m)}$ (or the node $F1_{(n,m+1)}$ becomes 0 V in the case where the potential of the bit line $R_m$ (or the bit line $R_{m+1}$) is 0 V at the time of writing. In other words, if the reading transistor $RTr1_{(n,m)}$ (or the reading transistor $RTr1_{(n,m+1)}$) is on when the potential of the word line $Q2_n$ is set to −1 V, it can be found that the potential of the bit line $R_m$ (or the bit line $R_{m+1}$) at the time of writing is 0 V.

On the other hand, if current does not flow between the bit lines $R_m$ and $R_{m+1}$ (or between the bit lines $R_{m+1}$ and $R_{m+2}$), it can be found that the potential of the bit line $R_m$ (or the bit line $R_{m+1}$) at the time of writing is +1 V. Thus, the value of the held data can be found.

Figure 16C:
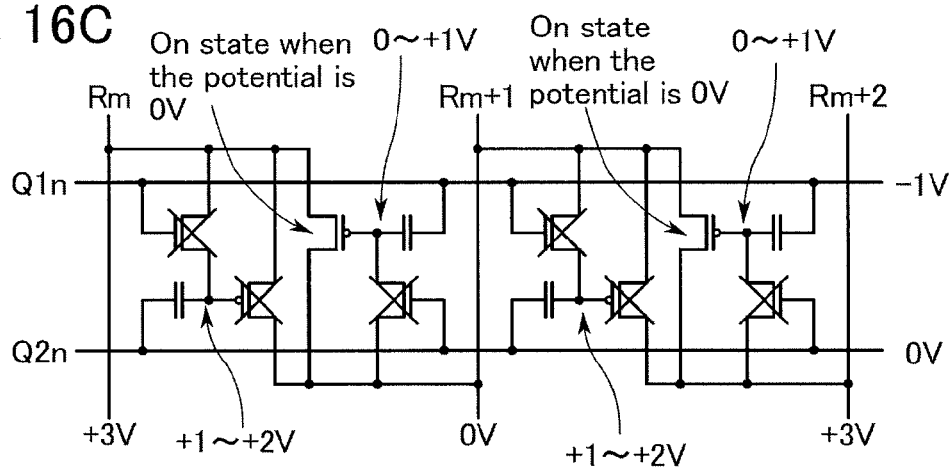

For reading data of the other memory cell in each of the memory units, as illustrated in FIG. 16C, the potential of the word line Q1$_n$ is decreased to −1 V, and the potential of the word line Q2$_n$ is increased to 0 V. Accordingly, the potentials of the node F1$_{(n,m)}$ and the node F1$_{(n,m+1)}$ become higher than or equal to +1 V and lower than or equal to +2 V. Meanwhile, the potentials of the node F2$_{(n,m)}$ and the node F2$_{(n,m+1)}$ become higher than or equal to 0 V and lower than or equal to +1 V.

Here, if the potential of the node F2$_{(n,m)}$ is 0 V (i.e., if the potential of the bit line R$_{m+1}$ at the time of writing is 0 V), the reading transistor RTr2$_{(n,m)}$ is turned on and current flows between the bit lines R$_m$ and R$_{m+1}$. Further, if the potential of the node F2$_{(n,m+1)}$ is 0 V (i.e., if the potential of the bit line R$_{m+2}$ at the time of writing is 0 V), the reading transistor RTr2$_{(n,m+1)}$ is turned on and current flows between the bit lines R$_{m+1}$ and R$_{m+2}$.

On the other hand, if current does not flow between the bit lines R$_m$ and R$_{m+1}$ (or between the bit lines R$_{m+1}$ and R$_{m+2}$), it can be found that the potential of the bit line R$_{m+1}$ (or the bit line R$_{m+2}$) at the time of writing is +1 V. Thus, the value of the held data can be found.

The method described above is a method of writing and reading two-level (one-bit) data. Of course, much more data, such as four-level (two-bit) data, eight-level (three-bit) data, or sixteen-level (four-bit) data for example, can be written and read.

In the above description, although the parasitic capacitance and the gate capacitances of the reading transistors RTr1$_{(n,m)}$ and RTr2$_{(n,m)}$ are much smaller than the capacitances of the capacitors C1$_{(n,m)}$ and C2$_{(n,m)}$ and ignored, potentials to be applied need to be determined in view of these capacitances in an actual memory cell.

The gate capacitances of the reading transistors RTr1$_{(n,m)}$ and RTr2$_{(n,m)}$ greatly fluctuate between an on state and an off state; therefore, the potentials of the gates of the reading transistors RTr1$_{(n,m)}$ and RTr2$_{(n,m)}$ are influenced by the fluctuation. As the ratios of the gate capacitances of the reading transistors RTr1$_{(n,m)}$ and RTr2$_{(n,m)}$ to the capacitances of the capacitors C1$_{(n,m)}$ and C2$_{(n,m)}$ are higher, the influence is bigger. Accordingly, the capacitances of the capacitors C1$_{(n,m)}$ and C2$_{(n,m)}$ are preferably larger than or equal to twice as large as the gate capacitances of the reading transistors RTr1$_{(n,m)}$ and RTr2$_{(n,m)}$.

Embodiment 11

Figure 14A:
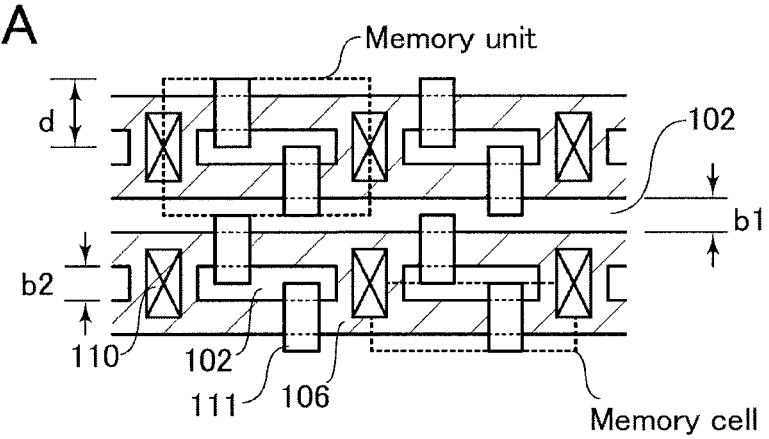
FIGS. 14A to 14C illustrate an example of layout and the like of wirings in a semiconductor memory device of the present invention.
Figure 14B:
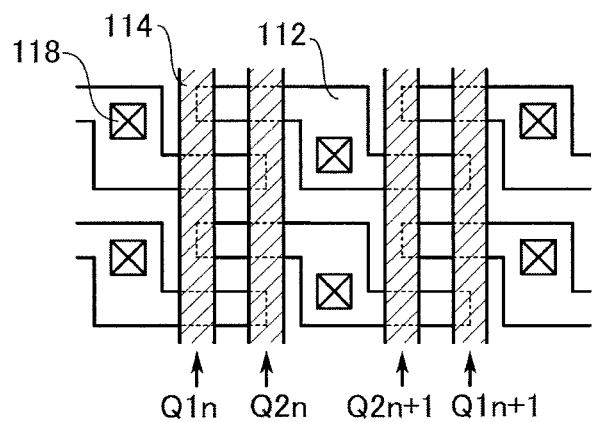
Figure 14C:
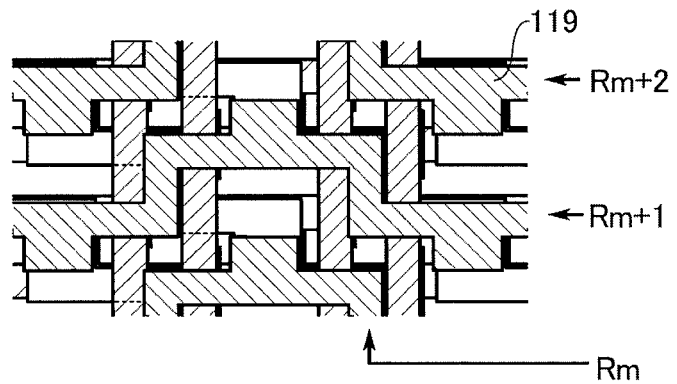

In this embodiment, the shape of still another semiconductor memory device will be described. FIGS. 14A to 14C illustrate an example of layout of a memory unit of the semiconductor memory device of this embodiment. The semiconductor memory device described in this embodiment has a circuit configuration corresponding to the circuit diagram illustrated in FIG. 4B. The semiconductor memory device described in this embodiment can be manufactured using the method described in Embodiment 3 although having a wiring pattern or the like which is different from that of Embodiment 3.

In FIG. 14A, main wirings, main electrodes, and the like provided over a single crystal silicon substrate are illustrated; this step is substantially the same as that of FIG. 9A. FIG. 14B illustrates main wirings, main electrodes, and the like, focusing on the transistor including an oxide semiconductor which is formed over the circuit illustrated in FIG. 14A; this step is also substantially the same as that of FIG. 9B.

In other words, the structure so far is the same as Embodiment 7. It should be noted that in order to form the circuit illustrated in FIG. 4B, the writing transistors and the reading transistors need to have different conductivity types. Therefore, it is necessary to modify an impurity used for doping the semiconductor substrate or the like, for example.

In this embodiment, a point different from Embodiment 7 is the pattern of the second wiring 119 formed over the structure of FIG. 14B. In other words, in Embodiment 7, because two kinds of bit lines R1 and R2 need to be formed and there is not enough layout margin, the bit lines R1 and R2 are formed of two layers of the second wiring 119 and the third wiring 122. Meanwhile in this embodiment, one kind of bit line (the bit line R) is arranged and the second wiring 119 is formed in a zigzag manner as illustrated in FIG. 14C, forming the bit lines R$_m$, R$_{m+1}$, R$_{m+2}$, and the like. Thus, the circuit illustrated in FIG. 4B can be manufactured in a simpler process.

Embodiment 12

In this embodiment, electronic devices using the circuit or semiconductor memory device or the driving method thereof described in any of Embodiments 1 to 11 will be described. The circuit or semiconductor memory device or the driving method thereof described in any of Embodiments 1 to 11 can be used for personal computers, portable communication devices, image display devices, image reproducing devices, imaging devices, game machines, electronic book readers, and the like.

This application is based on Japanese Patent Application serial no. 2010-101571 filed with Japan Patent Office on Apr. 27, 2010 and Japanese Patent Application serial no. 2010-102329 filed with Japan Patent Office on Apr. 27, 2010, the entire contents of which are hereby incorporated by reference.

EXPLANATION OF REFERENCE

101: single crystal silicon substrate, 102: element separation region; 103: gate insulating film, 104: dummy gate, 105: silicide region, 106: conductive region, 107: first interlayer insulator, 107a: second interlayer insulator, 108: first opening, 109: second opening, 110: first connection electrode, 111: gate electrode, 112: oxide semiconductor region, 113: gate insulating film, 114: first wiring, 115: region exhibiting n-type conductivity, 116: capacitor, 117: third interlayer insulator, 118: second connection electrode, 119: second wiring, 120: fourth interlayer insulator, 121: third connection electrode, 122: third wiring, 123: writing transistor, 124: reading transistor, WTr: writing transistor, RTr: reading transistor, C: capacitor, P: reading word line, Q: writing word line, R: bit line, and S: bias line.

The invention claimed is:

1. A semiconductor memory device comprising a first wiring, a second wiring, a third wiring, a fourth wiring, and a memory unit including a first memory cell and a second memory cell, which are arranged in a matrix,
    wherein the first wiring is parallel to the second wiring,
    wherein the third wiring is parallel to the fourth wiring,
    wherein the first wiring is orthogonal to the third wiring,
    wherein the first memory cell includes a first transistor, a second transistor, and a first capacitor,
    wherein the second memory cell includes a third transistor, a fourth transistor, and a second capacitor,
    wherein a drain of the first transistor is connected to a gate of the second transistor and one electrode of the first capacitor, wherein a drain of the third transistor is connected to a gate of the fourth transistor and one electrode of the second capacitor, wherein a gate of the first transistor and the other electrode of the second capacitor are connected to the first wiring, wherein a gate of the third transistor and the other electrode of the first capacitor are connected to the second wiring, wherein a source of the first transistor, a source of the second transistor, and a drain of the fourth transistor are connected to the third wiring, and wherein a source of the third transistor, a source of the fourth transistor, and a drain of the second transistor are connected to the fourth wiring.

2. The semiconductor memory device according to claim 1, wherein the first transistor has a different conductivity type from the second transistor.

3. The semiconductor memory device according to claim 1, wherein a conductivity type of the first transistor is an n-channel type.

4. The semiconductor memory device according to claim 1, wherein a conductivity type of the second transistor is a p-channel type.

5. The semiconductor memory device according to claim 1, wherein the third transistor has a different conductivity type from the fourth transistor.

6. The semiconductor memory device according to claim 1, wherein a conductivity type of the third transistor is an n-channel type.

7. The semiconductor memory device according to claim 1, wherein a conductivity type of the fourth transistor is a p-channel type.

8. The semiconductor memory device according to claim 1, wherein at least one of the first transistor and the third transistor includes a channel including a semiconductor having a bandgap of 2.5 eV or larger.

9. The semiconductor memory device according to claim 8, wherein the semiconductor is an oxide semiconductor.

10. The semiconductor memory device according to claim 9, wherein the oxide semiconductor comprises at least one of gallium, indium, and zinc.

11. The semiconductor memory device according to claim 1, further comprising a device which supplies the same signal to the third wiring and the fourth wiring when data is written.

12. A semiconductor memory device comprising a first wiring, a second wiring, a third wiring, a fourth wiring, a fifth wiring, a first memory cell, a second memory cell, a third memory cell, and a fourth memory cell, which are arranged in a matrix, wherein the first wiring is parallel to the second wiring, wherein the third wiring, the fourth wiring, and the fifth wiring are parallel to each other, wherein the first wiring is orthogonal to the third wiring, wherein the first memory cell includes a first transistor, a second transistor, and a first capacitor, wherein the second memory cell includes a third transistor, a fourth transistor, and a second capacitor, wherein the third memory cell includes a fifth transistor, a sixth transistor, and a third capacitor, wherein the fourth memory cell includes a seventh transistor, an eighth transistor, and a fourth capacitor, wherein a drain of the first transistor is connected to a gate of the second transistor and one electrode of the first capacitor, wherein a drain of the third transistor is connected to a gate of the fourth transistor and one electrode of the second capacitor, wherein a drain of the fifth transistor is connected to a gate of the sixth transistor and one electrode of the third capacitor, wherein a drain of the seventh transistor is connected to a gate of the eighth transistor and one electrode of the fourth capacitor, wherein a gate of the first transistor, the other electrode of the second capacitor, a gate of the fifth transistor, and the other electrode of the fourth capacitor are connected to the first wiring, wherein a gate of the third transistor, the other electrode of the first capacitor, a gate of the seventh transistor, and the other electrode of the third capacitor are connected to the second wiring, wherein a source of the first transistor, a source of the second transistor, and a drain of the fourth transistor are connected to the third wiring, wherein a source of the third transistor, a source of the fourth transistor, a drain of the second transistor, a source of the fifth transistor, a source of the sixth transistor, and a drain of the eighth transistor are connected to the fourth wiring, and wherein a source of the seventh transistor, a source of the eighth transistor, and a drain of the sixth transistor are connected to the fifth wiring.

13. The semiconductor memory device according to claim 12, wherein the first transistor and the third transistor have the same conductivity type.

14. The semiconductor memory device according to claim 12, wherein the second transistor and the fourth transistor have the same conductivity type.

15. The semiconductor memory device according to claim 12, wherein the first transistor has a different conductivity type from the second transistor.

16. The semiconductor memory device according to claim 12, wherein a conductivity type of the first transistor and the third transistor is an n-channel type.

17. The semiconductor memory device according to claim 12, wherein a conductivity type of the second transistor and the fourth transistor is a p-channel type.

18. The semiconductor memory device according to claim 12, wherein at least one of the first transistor, the third transistor, the fifth transistor, and the seventh transistor includes a channel including a semiconductor having a bandgap of 2.5 eV or larger.

19. The semiconductor memory device according to claim 18, wherein the semiconductor is an oxide semiconductor.

20. The semiconductor memory device according to claim 19, wherein the oxide semiconductor comprises at least one of gallium, indium, and zinc.

21. The semiconductor memory device according to claim 12, further comprising a device which supplies the same signal to the third wiring and the fourth wiring when data is written.

22. A semiconductor memory device comprising:
a first electrode, a second electrode, a third electrode, and a fourth electrode over a substrate,
a first connection electrode between the first electrode and the second electrode,
a second connection electrode between the third electrode and the fourth electrode,
a first semiconductor, a second semiconductor, a third semiconductor, and a fourth semiconductor over the first electrode, the second electrode, the third electrode, and the fourth electrode, respectively,
a first wiring over the first electrode, the third electrode, the first semiconductor and the third semiconductor, and a second wiring over the second electrode, the fourth electrode, the second semiconductor and the fourth semiconductor, wherein the first electrode, the second electrode, and the first connection electrode are arranged in a line in a first direction, wherein the third electrode, the fourth electrode, and the second connection electrode are arranged in a line in a second direction, wherein the first wiring is parallel to the second wiring in a third direction, and wherein the first direction and the second direction are orthogonal to the third direction.

23. The semiconductor memory device according to claim 22, wherein at least one of the first semiconductor, the second semiconductor, the third semiconductor, and the fourth semiconductor includes a channel including a semiconductor having a bandgap of 2.5 eV or larger.

24. The semiconductor memory device according to claim 22, wherein at least one of the first semiconductor, the second semiconductor, the third semiconductor, and the fourth semiconductor is an oxide semiconductor.

25. The semiconductor memory device according to claim 24, wherein the oxide semiconductor comprises at least one of gallium, indium, and zinc.

26. The semiconductor memory device according to claim 22, wherein the substrate is a single crystal silicon substrate.

27. A semiconductor memory device comprising:

a first electrode, a second electrode, a third electrode, and a fourth electrode over a substrate, a connection electrode between the first electrode, the third electrode and the second electrode, the fourth electrode, a first semiconductor over the first electrode, a second semiconductor over the second electrode, the third electrode, and the connection electrode, a third semiconductor over the fourth electrode, and a first wiring, a second wiring, a third wiring, and a fourth wiring over the first electrode, the second electrode, the third electrode, and the fourth electrode, respectively, and over the first semiconductor, the second semiconductor, and the third semiconductor, wherein the first electrode and the third electrode are arranged in a line in a first direction, wherein the second electrode and the fourth electrode are arranged in a line in a second direction, wherein the first direction is parallel to the second direction, wherein the first wiring, the second wiring, the third wiring, and the fourth wiring are parallel to each other in a third direction, and wherein the first direction and the second direction are orthogonal to the third direction.

28. The semiconductor memory device according to claim 27, wherein at least one of the first semiconductor, the second semiconductor, the third semiconductor, and the fourth semiconductor includes a channel including a semiconductor having a bandgap of 2.5 eV or larger.

29. The semiconductor memory device according to claim 27, wherein at least one of the first semiconductor, the second semiconductor, the third semiconductor, and the fourth semiconductor is an oxide semiconductor.

30. The semiconductor memory device according to claim 29, wherein the oxide semiconductor comprises at least one of gallium, indium, and zinc.

31. The semiconductor memory device according to claim 27, wherein the substrate is a single crystal silicon substrate.

\* \* \* \* \*

UNITED STATES PATENT AND TRADEMARK OFFICE
CERTIFICATE OF CORRECTION

PATENT NO. : 8,605,477 B2
APPLICATION NO. : 13/093018
DATED : December 10, 2013
INVENTOR(S) : Yasuhiko Takemura It is certified that error appears in the above-identified patent and that said Letters Patent is hereby corrected as shown below:

In the Specifications

Column 4, line 47, replace "P." with --$P_n$.--;

Column 12, line 65, replace "KO." with --$R_m$).--;

Column 13, line 45, replace "Q," with --$Q_n$--;

Column 13, line 46, replace "P," with --$P_n$--;

Column 13, line 59, replace "P." with --$P_n$.--;

Column 14, line 13, replace "P," with --$P_n$--;

Column 15, line 59, replace "Q," with --$Q_n$--;

Column 17, line 20, replace "P," with --$P_n$--;

Column 17, line 32, replace "$R_n$" with --$R_m$--;

Column 20, line 45, replace "fouled" with --formed--;

Column 20, line 50, before "preferably" replace "$cm^3$," with --$cm^{-3}$,--;

Column 25, line 36, after "and $R2_m$" insert --,--;

Column 25, line 51, before "becomes" insert --$F1_{(n,m)}$--;

Column 26, line 43, after "capacitors" insert --$C1_{(n,m)}$--;

Signed and Sealed this
Thirteenth Day of May, 2014

Michelle K. Lee
*Deputy Director of the United States Patent and Trademark Office*

CERTIFICATE OF CORRECTION (continued)
U.S. Pat. No. 8,605,477 B2

Column 31, line 39, replace "fanned" with --formed--;

Column 32, line 9, after "WTr2$_{(n,m)}$" insert --,--;

Column 33, line 34, before "becomes" insert --F1$_{(n,m)}$--;

Column 34, line 62, replace "WTr1$_{(n,m)}$, WTr1$_{(n,m)}$, and WTr2$_{(n,m)}$," with --WTr1$_{(n,m)}$, WTr2$_{(n,m)}$, WTr1$_{(n,m+1)}$, and WTr2$_{(n,m+1)}$,--;

Column 34, line 63, replace "RTr1$_{(n,m)}$, RTr1$_{(n,m)}$, and RTr2$_{(n,m)}$," with --RTr1$_{(n,m)}$, RTr2$_{(n,m)}$, RTr1$_{(n,m+1)}$, and RTr2$_{(n,m+1)}$,--;

Column 35, line 6, replace "RTr1$_{(n,m)}$, RTr2$_{(n,m)}$, RTr1$_{(n,m)}$, and RTr2$_{(n,m)}$," with --RTr1$_{(n,m)}$, RTr2$_{(n,m)}$, RTr1$_{(n,m+1)}$, and RTr2$_{(n,m+1)}$,--;

Column 35, line 41, replace "WTr1$_{(n,m)}$" with --WTr1$_{(n,m+1)}$--;

Column 35, line 57, after "R$_m$" delete ",";

Column 36, line 32, before "WTr2$_{(n,m+1)}$" insert --WTr1$_{(n,m+1)}$,--;

Column 36, line 36, replace "F$_{(n,m)}$" with --F1$_{(n,m)}$--;

Column 36, line 53, replace "F1$_{(n,m+1)}$" with --F1$_{(n,m+1)}$)--;

Column 36, line 57, before "becomes" replace "F1$_{(n,m+1)}$" with --F1$_{(n,m+1)}$)--.